(12) United States Patent
Wagner et al.

(10) Patent No.: US 7,491,892 B2
(45) Date of Patent: Feb. 17, 2009

(54) STRETCHABLE AND ELASTIC INTERCONNECTS

(75) Inventors: Sigurd Wagner, Princeton, NJ (US); Stephanie Perichon Lacour, Lawrenceville, NJ (US); Zhigang Suo, Lexington, MA (US)

(73) Assignee: Princeton University, Princeton, NJ (US)

( * ) Notice: Subject to any disclaimer, the term of this patent is extended or adjusted under 35 U.S.C. 154(b) by 0 days.

(21) Appl. No.: 10/402,087

(22) Filed: Mar. 28, 2003

(65) Prior Publication Data

US 2004/0192082 A1 Sep. 30, 2004

(51) Int. Cl.
*H05K 1/11* (2006.01)
(52) U.S. Cl. ..................................................... 174/254
(58) Field of Classification Search ................... 439/67, 439/33, 162; 174/69, 117 FF, 254, 256, 258; 361/749, 750; 428/209, 901
See application file for complete search history.

(56) References Cited

U.S. PATENT DOCUMENTS

| | | | | |
|---|---|---|---|---|
| 2,143,649 A | * | 1/1939 | Dansard | 174/69 |
| 3,004,229 A | * | 10/1961 | Stearns | 333/238 |
| 3,300,572 A | * | 1/1967 | Dahlgren et al. | 174/69 |
| 3,576,941 A | * | 5/1971 | Colglazier | 174/117 FF |
| 3,796,986 A | * | 3/1974 | Tamburro | 439/329 |
| 3,818,279 A | * | 6/1974 | Seeger et al. | 361/751 |
| 4,435,740 A | * | 3/1984 | Huckabee et al. | 361/749 |

(Continued)

FOREIGN PATENT DOCUMENTS

JP 6-36620 * 2/1994

OTHER PUBLICATIONS

Bowden et al., "Spontaneous Formation of Ordered Structures in Thin Films of Metals Supported on an Elastomeric Polymer;" Nature 393:146-49 (1998).

(Continued)

*Primary Examiner*—Neil Abrams
(74) *Attorney, Agent, or Firm*—Mathews, Shepherd, McKay & Bruneau, P.A.

(57) ABSTRACT

The present invention relates to stretchable interconnects which can be made in various geometric configurations, depending on the intended application. The stretchable interconnects can be formed of an electrically conducting film or an elastomer material to provide elastic properties in which the interconnects can be reversibly stretched in order to stretch and relax the elastomer material to its original configuration. Alternatively, stretchable interconnects can be formed of an electrically conducting film or a plastic material to provide stretching of the material to a stretched position and retaining the stretched configuration. The stretchable interconnect can be formed of a flat 2-dimensional conductive film covering an elastomeric or plastic substrate. When this structure is stretched in one or two dimensions, it retains electrical conduction in both dimensions. Alternatively, the stretchable and/or elastic interconnects can be formed of a film or stripe that is formed on an elastomeric or plastic substrate such that it is buckled randomly, or organized in waves with long-range periodicity. The buckling or waves can be induced by various techniques, including: release of built-in stress of the conductive film or conductive stripe; pre-stretching the substrate prior to the fabrication of the conductive film or conductive stripe; and patterning of the surface of the substrate prior to the fabrication of the metal film. The stretchable interconnect can be formed of a plurality of conductive films or conductive stripes embedded between a plurality of layers of a substrate formed of an elastomer or plastic.

19 Claims, 25 Drawing Sheets

U.S. PATENT DOCUMENTS

| | | | | |
|---|---|---|---|---|
| 4,475,141 | A | * | 10/1984 | Antonevich .................. 361/220 |
| 4,855,867 | A | * | 8/1989 | Gazdik et al. ................ 361/719 |
| 4,945,191 | A | * | 7/1990 | Satsuka et al. ................. 174/69 |
| 4,991,290 | A | * | 2/1991 | MacKay ....................... 29/884 |
| 5,207,585 | A | * | 5/1993 | Byrnes et al. .................. 439/66 |
| 5,244,410 | A | * | 9/1993 | Demus et al. ................ 439/497 |
| 5,399,982 | A | * | 3/1995 | Driller et al. ................. 324/754 |
| 5,468,159 | A | * | 11/1995 | Brodsky et al. .............. 439/501 |
| 5,512,131 | A | | 4/1996 | Kumar et al. ................ 438/738 |
| 5,563,521 | A | * | 10/1996 | Crumly ....................... 324/757 |
| 5,691,041 | A | * | 11/1997 | Frankeny et al. ............. 428/209 |
| 5,742,484 | A | * | 4/1998 | Gillette et al. ............... 361/789 |
| 5,816,848 | A | * | 10/1998 | Zimmerman ................ 439/502 |
| 5,824,959 | A | * | 10/1998 | Mista et al. ............... 174/117 F |
| 5,936,850 | A | * | 8/1999 | Takahashi et al. ........... 361/784 |
| 6,175,081 | B1 | * | 1/2001 | Hsieh ...................... 174/117 F |
| 6,195,261 | B1 | * | 2/2001 | Babutzka et al. ............. 361/752 |
| 6,319,012 | B1 | * | 11/2001 | Moessinger et al. ............ 439/33 |
| 6,341,504 | B1 | * | 1/2002 | Istook ........................ 66/172 E |
| 6,353,188 | B1 | * | 3/2002 | Fernandez .................. 174/255 |
| 6,360,615 | B1 | * | 3/2002 | Smela .................... 73/862.474 |
| 6,507,989 | B1 | | 1/2003 | Bowden et al. ............. 29/592.1 |
| 6,518,168 | B1 | | 2/2003 | Clem et al. .................. 438/623 |
| 6,613,979 | B1 | * | 9/2003 | Miller et al. ............... 174/52.2 |
| 6,743,982 | B2 | | 6/2004 | Biegelsen .................... 174/69 |

OTHER PUBLICATIONS

Benslimane, M. & Gravesen, P., "Mechanical Properties of Dielectric Elastomer Actuators with Smart Metallic Compliant Electrodes;" Smart Structures and Materials 2002: Electroactive Polymer Actuators and Devices (EAPAD), Yoseph Bar-Cohen, Editor, Proceedings of SPIE 4695:150-57 (2002).

Watanabe et al., "Wrinkled Polypyrrole Electrode for Electroactive Polymer Actuators;" J Appl Phys 92(8):4631-37 (2002).

Cairns et al., "Strain-Dependent Electrical REsistance of Tin-Doped Idium Oxide on Polymer Substrates;" Appl Phys Letters 76(11):1425-27 (2000).

Bowden et al., "The Controlled Formation of Ordered, Sinusoidal Structures by Plasma Oxidation of an Elastomeric Polymer;" Appl Phys Letters 75(17):2557-59 (1999).

Chen et al., "The Fracture of Brittle Thin Films on Compliant Substrates in Flexible Displays;" Engr Fract Mech 69:597-603 (2002).

Kim, J. & Lee, H., "Wave Formation by Heating in Thin Metal Film of an Elastomer;" J Poly Sci, Part B: Polymer Physics 39:1122-28 (2001).

Huang, R. & Suo, Z., Wrinkling of a Compressed Elastic Film on a Viscous Layer; J Appl Phys 91(3):1135-42 (2002).

* cited by examiner

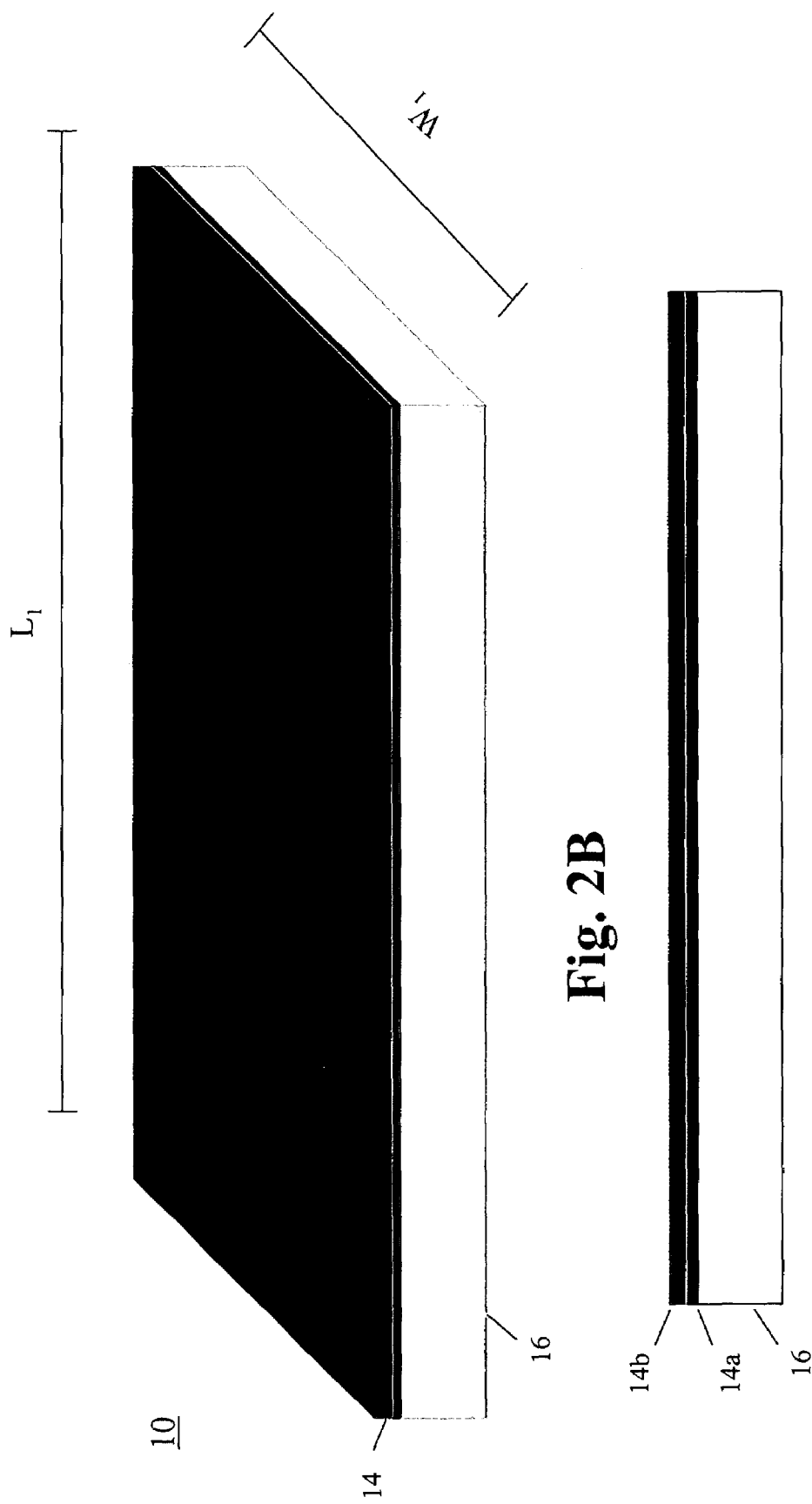

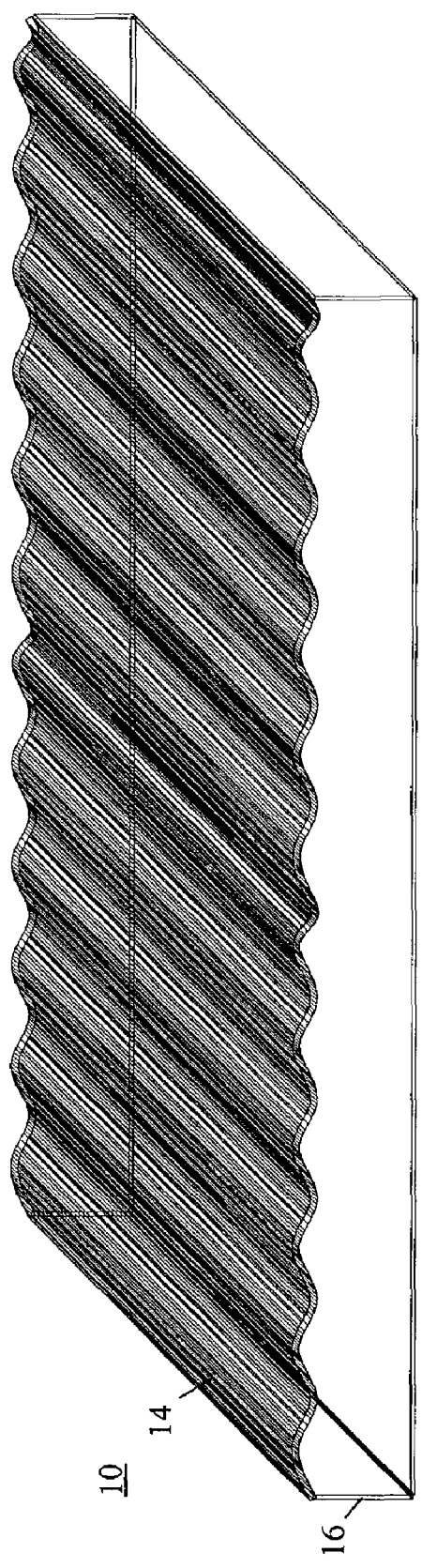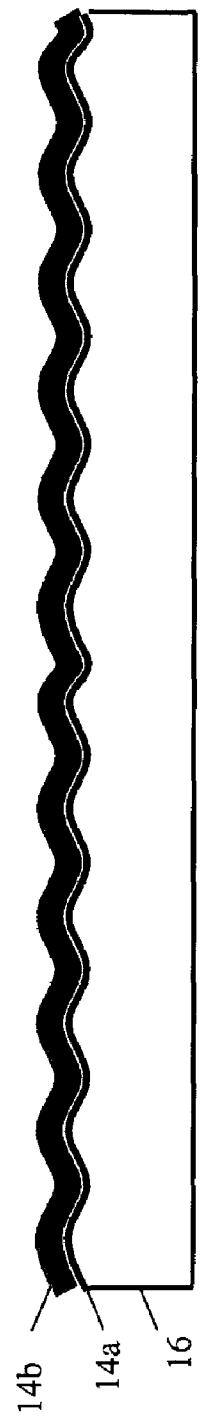
Fig. 3A
Fig. 3B

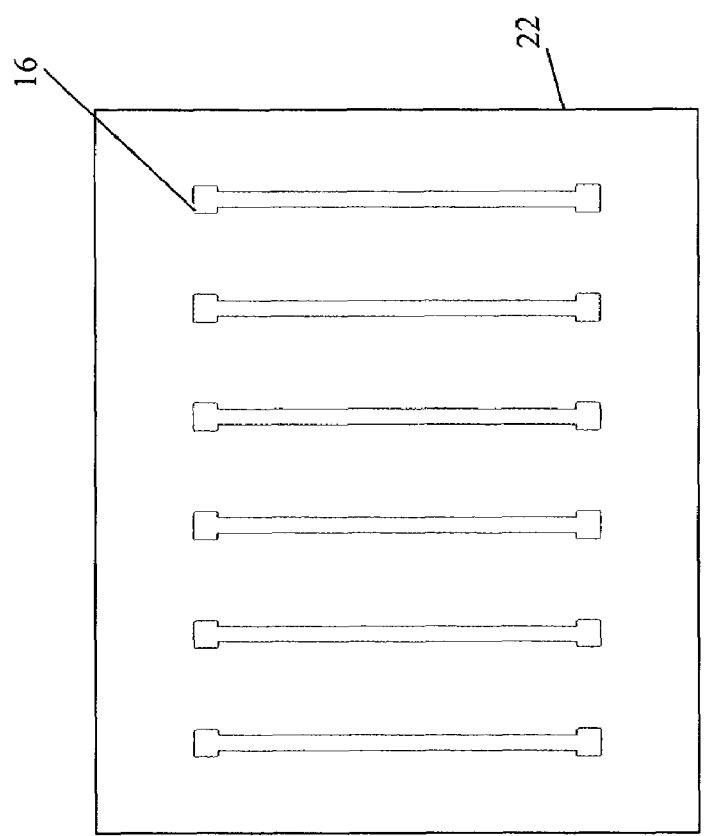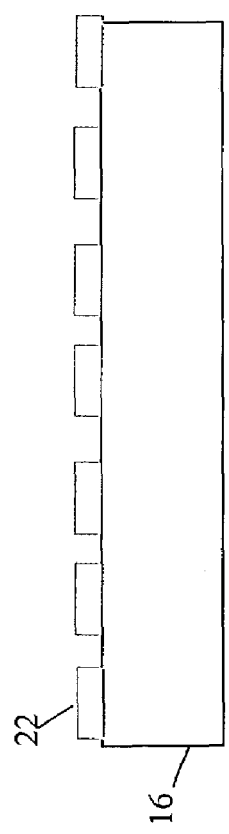
Fig. 5A
Fig. 5B

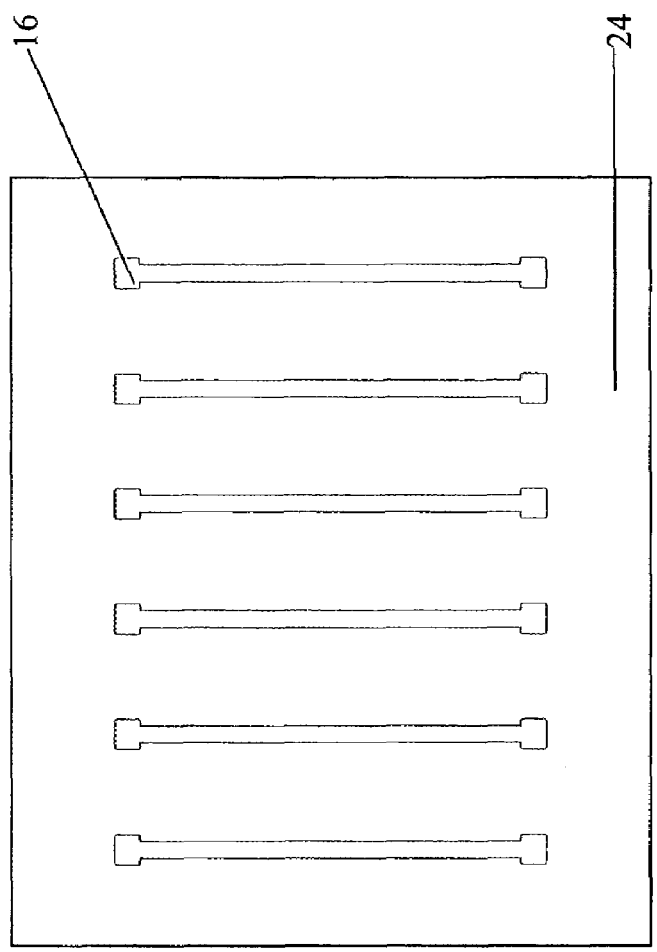
Fig. 7A
Fig. 7B

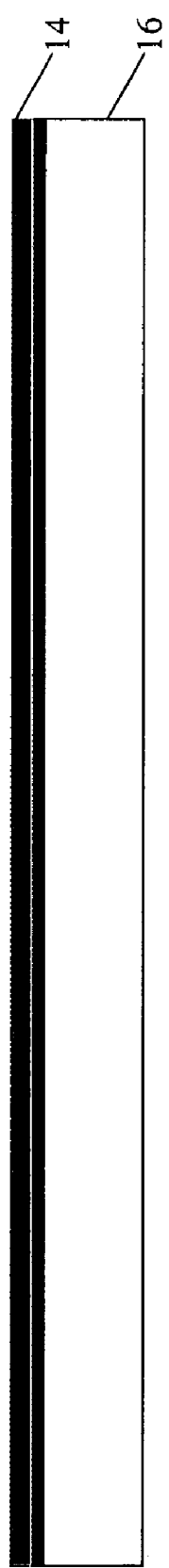
Fig. 11A
Fig. 11B

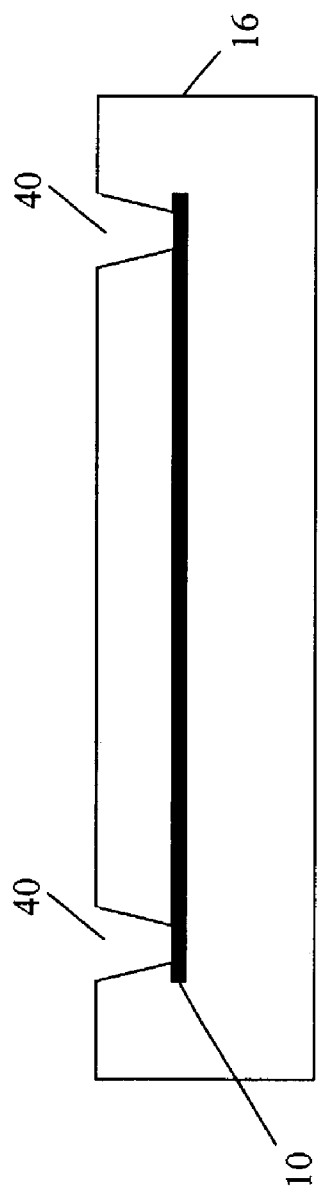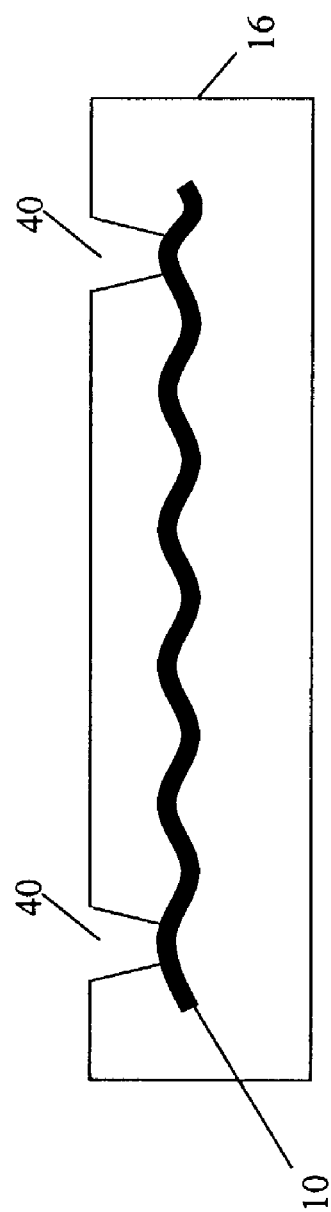
Fig. 14A
Fig. 14B

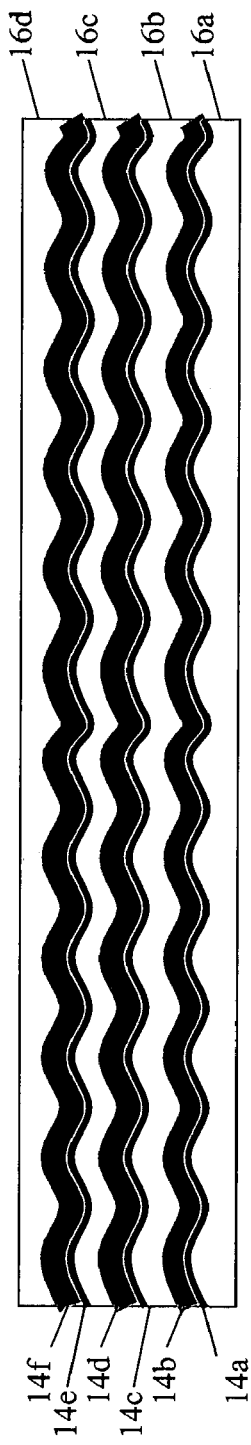
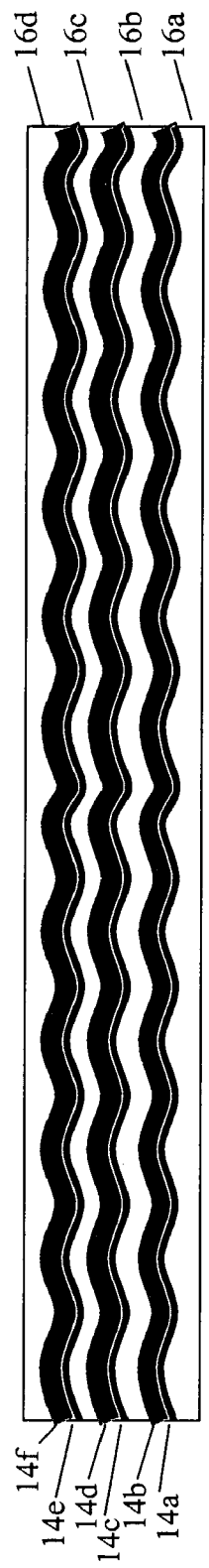
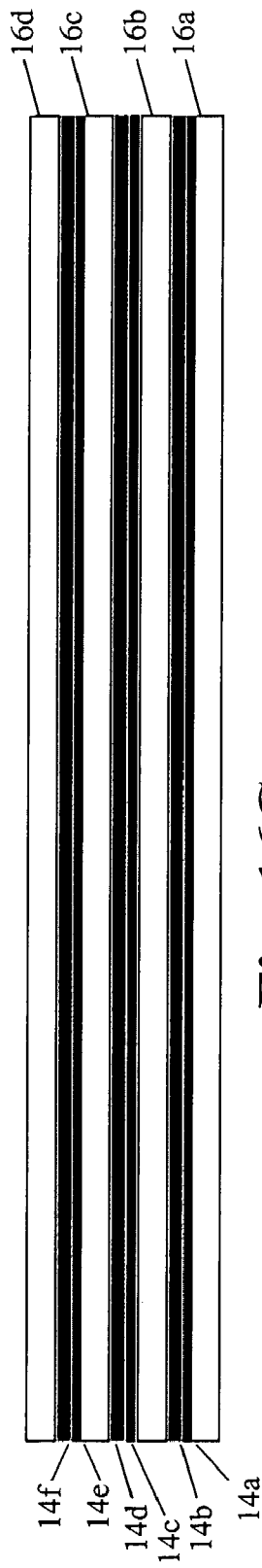
Fig. 16A
Fig. 16B
Fig. 16C

ε = 8 %

ε = 16 %

STRETCHABLE AND ELASTIC INTERCONNECTS

BACKGROUND OF THE INVENTION

1. Field of the Invention

The present invention relates to stretchable interconnects providing electrical connection in which conductive films or stripes are formed on or embedded within deformable substrates and the substrates may be pre-stretched before fabrication of the conductive film or stripe.

2. Related Art

A number of electronic circuits require low resistance connections between parts that are mechanically separate and/or can move against each other. Examples include: large-area electronics that can be bent or 3-D deformed; printed wire boards with creases along which they can be folded to achieve high density; and integrated circuits that move against their packages under the influence of thermal expansion. Typically, when such movement occurs the electrical contacts between interconnects and circuits are subjected to mechanical stress. If this stress results in mechanical debonding, the circuit also fails electrically.

Photolithographically patterned stretchable interconnects for electrically connecting electronic devices which are supported for movement relative to one another have been described. U.S. Patent Application No. 2002-0294701 describes a stretchable interconnect formed of a coiled conductor. The coiled conductor is formed by photolithography. In this technique, a negative or positive resist (photoresist) is coated onto an exposed surface of a material. The resist is irradiated in a predetermined pattern, and irradiated (positive resist) or nonirradiated (negative resist) portions of the resist are removed from the surface to produce a predetermined resist pattern on the surface. This can be followed by one or more procedures such as etching, plating, and the like. The coiled conductor is formed of a metal or alloy having a stress gradient extending through the thickness of the conductor. The interconnects become stretchable when a supporting substrate is removed from the interconnect.

Formation of ordered structures in thin films of metals supported on an elastomeric polymer have been described in Bowden, N. et al., Nature, 393, 146 (1998). The ordered structures were spontaneously generated by buckling of thin metal films owing to thermal contraction of an underlying substrate. Films from the vapor phase are deposited on a thermally expanded polymer of polydimethyl siloxane (PDMS). Subsequent cooling of the polymer creates compressive stress in the metal film that is relieved by buckling with a uniform wavelength of 20-50 micrometers. The waves can be controlled and oriented by relief structures in the surface of the polymer to provide intricate ordered patterns. It is described that the patterning process may find applications in optical devices.

Inherent flexibility of thin-film electronics can be used in a variety of applications. One approach to making flexible and deformable structures is to use polymer substrates. The flexibility of the polymer substrate offers application opportunities that utilize curved and/or deformable surfaces. Retina-shaped photosensor arrays described in Hsu, P. et al., Appl. Phys. Lett. 81, 1723-5 (2002), electro-active polymer actuators described in Pelrine, R. et al., Smart Structures and Materials 2001: Electroactive Polymer Actuators and Devices, edited by Y. Bar-Cohen, SPIE Proc. 4329, Bellingham, WA, (2001) pp. 334-349, or stretchable sensitive skin described in Lumelsky, V. J. et al. IEEE Sensors journal 1, 41 (2001) are electronic systems that combine electronic functions with the flexibility of plastic substrates.

Dielectric elastomer actuators with smart metallic electrodes made of silver were described in Benslimane et al., Smart Structures and Materials 2002, Electroactive Polymer Actuators and Devices, edited by Y. Bar-Cohen, 150 Proceedings of SPIE Vol. 4695 (2002). An elastomer film is spin coat ings on a mold for forming a corrugated quasisinusoidal profile. Thin metal films are deposited on the corrugated surfaces of the elastomer film. Since the elastomer conserves volume when it is deferred, the electrically-induced stress in the film thickness direction is converted to stress in the direction of actuation. The corrugation depth-to-period ratio is optimized in order to obtain elongation of about 33% before the metal electrode breaks.

An electrode for a bending-electrostrictive polyurethane actuator was described in Watanabe, M. et al., J. Appl. Phys. 92, 4631 (2002). The wrinkled electrode was prepared by in situ deposition of polypyrrole onto a polyurethane elastomer film that was being uniaxially drawn. After the deposition, the film was released from the drawing to make the electrode wrinkle. The bending actuator of the polyurethane film with the wrinkled electrode was improved compared to an unwrinkled one. Polypyrrole is an organic conductor, with an electrical conductivity much lower than that of typical interconnect metals, e.g., gold or aluminum. Accordingly, organic conductors have a greatly restricted applicability compared to metallic conductors.

It is desirable to provide an improved stretchable and elastic electrical interconnect of thin metal films which can be used to provide electrical connection in applications such as thin-film electronics and conformable integrated circuits.

SUMMARY OF THE INVENTION

It has been found that thin electrically conducting films can be stretched far when they are made on easily deformable substrates. The electrically conducting films can be stretched far more than free-standing metal films and beyond predictions based on geometric concepts of stretchable films. When tightly bonded to the substrate, the electrically conducting films remain electrically conducting to high values of extension and can be used as stretchable electrical interconnections. When the substrate is an elastomer, electrical conductance is retained over multiple cycles of stretching and relaxation, and such films on elastomeric substrates can be used as elastic electrical interconnects. When the substrate deforms plastically, the film can be stretched once and retains electrical conduction. For example, the structures can be stretched by a factor of two or greater in length.

The present invention relates to stretchable interconnects which can be made in various geometric configurations, depending on the intended application. The stretchable interconnects can be formed of an elastomer material to provide elastic properties in which the interconnects can be reversibly stretched in order to stretch and relax the elastomer material to its original configuration. Alternatively, stretchable interconnects can be formed of a plastic material to provide stretching of the material to a stretched position and retaining the stretched configuration. In one embodiment, the stretchable interconnect is formed of a flat 2-dimensional conductive film covering an elastomeric, polymeric or plastic substrate. When this structure is stretched in one or two dimensions, it retains electrical conduction in both dimensions.

In another embodiment, the stretchable interconnect is formed of a conductive stripe of a conductive material on an elastomeric or plastic substrate. The conductive stripe can be nearly one-dimensional, meaning that it is much longer than wide. When the conductive stripe is stretched, preferably along its longitudinal axis, it retains electrical conduction. Alternatively, conductive films or conductive stripes can be embedded within the elastomeric or plastic substrate.

In other aspects of the present invention, the stretchable and/or elastic interconnects are formed of a film or stripe that is formed on an elastomeric or plastic substrate such that it is buckled randomly, or organized in waves with long-range periodicity. The buckling or waves can be induced by various techniques, including: built-in compressive stress in the conductive film or conductive stripe; pre-stretching the substrate prior to the fabrication of the conductive film or conductive stripe; and patterning of the surface of the substrate prior to the fabrication of the metal film.

In another embodiment of the present invention, the stretchable interconnect is formed of a plurality of conductive films or conductive stripes embedded between a plurality of layers of a substrate formed of an elastomer or plastic. In another aspect, the stretchable interconnect of the present invention can include conductive stripes that run in different directions on top of an elastomeric or plastic substrate, or are embedded in it, either at a single level, or in a plurality of layers. In one embodiment, the stretchable interconnects are formed of conductive films or stripes oriented in all three directions, atop or within an elastomer or plastic matrix.

The present invention is a technique to reduce the mechanical stress on interconnects to low values by making stretchable interconnects. The stretchable interconnects of the present invention are useful for flexible and deformable electronics, and for making space-saving interconnections. Applications for stretchable and/or elastic interconnects of the present invention include: flexible and deformable electronics, in which subcircuits are connected with low resistance conductors that can be stretched or compressed once or many times; thin film metal connectors between mechanically separate circuits; and packaging of integrated circuits with stretchable interconnects that do not place the connections of the IC under mechanical load.

The invention will be more fully described by reference to the following drawings.

BRIEF DESCRIPTION OF THE DRAWINGS

FIG. 2B is a perspective schematic diagram of a stretchable interconnect formed by application of a conductive film to the substrate shown in FIG. 2A.
FIG. 2C is a side elevational view of the stretchable interconnect shown in FIG. 2B.
FIG. 3A is a perspective schematic view of a stretchable interconnect having a buckled or wavy profile.
FIG. 3B is a side elevational view of the stretchable interconnect shown in FIG. 3A.
FIG. 5A is a top plan view of a compliant shadow mask used for forming conductive stripes.
FIG. 5B is a cross-sectional view of the shadow mask shown in FIG. 5A.
FIG. 7A is a top plan view of a photoresist mask used for forming conductive stripes.
FIG. 7B is a cross-sectional view of the photoresist mask shown in FIG. 7A.
FIG. 11A is a side elevational view of a stretchable interconnect formed in accordance with FIGS. 2A-2B.
FIG. 11B is a side elevational view of the stretchable interconnect of FIG. 11A while stretching.
FIG. 14A is a cross-sectional schematic view of a stretchable interconnect embedded in a substrate having a flat profile.
FIG. 14B is a cross-sectional schematic view of a stretchable interconnect embedded in a substrate having a wavy profile.
FIG. 16A is a side elevational view of a stack of stretchable interconnects with each layer having a wavy profile.
FIG. 16B is a side elevational view of the stack of stretchable interconnects of 16A when stretching at a lower value than the pre-stretched percentage X %.
FIG. 16C is a side elevational view of the stack of stretchable interconnects of 16B when stretched to a value greater than the initial pre-stretched percentage X %.

DETAILED DESCRIPTION

Figure 1A:
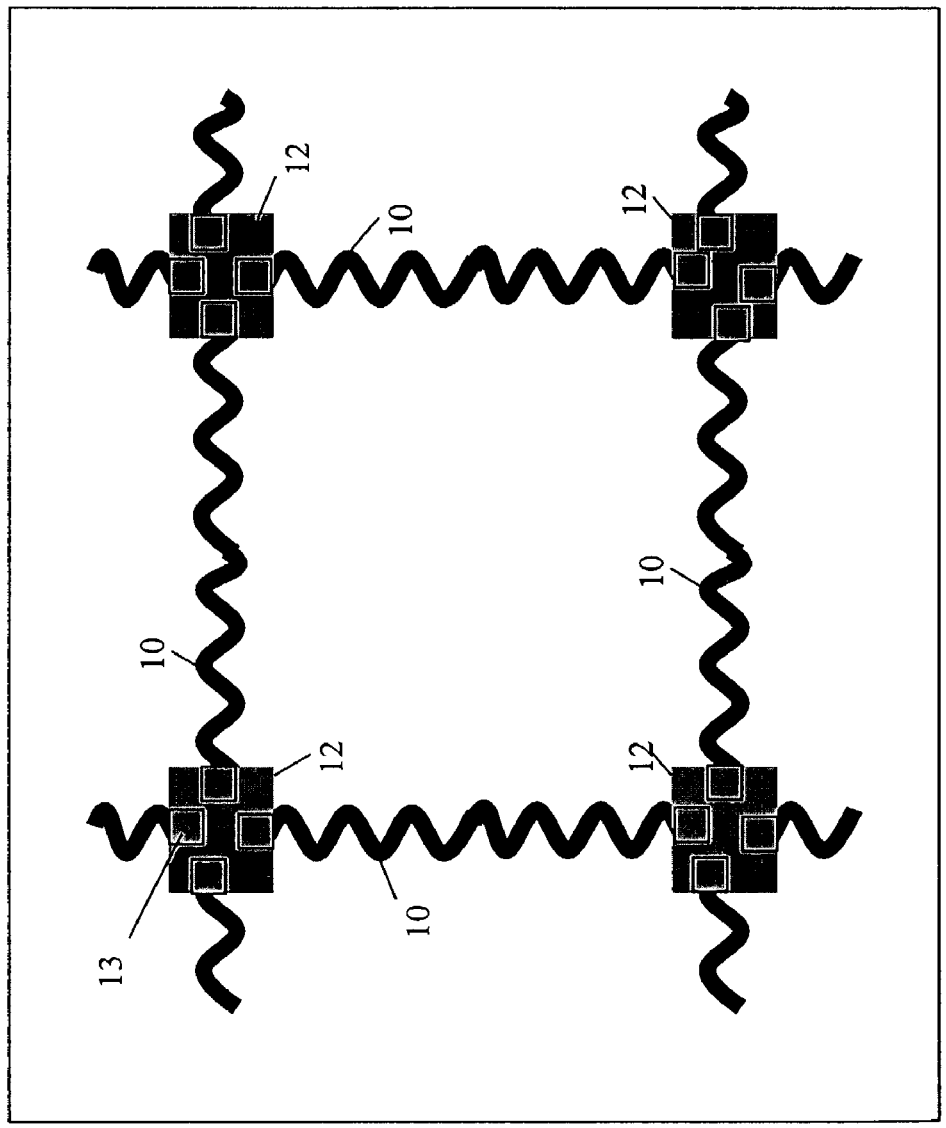
FIG. 1A is a top view of an array of electronic devices connected with stretchable interconnects having a wavy profile, in accordance with the teaching of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 1B:
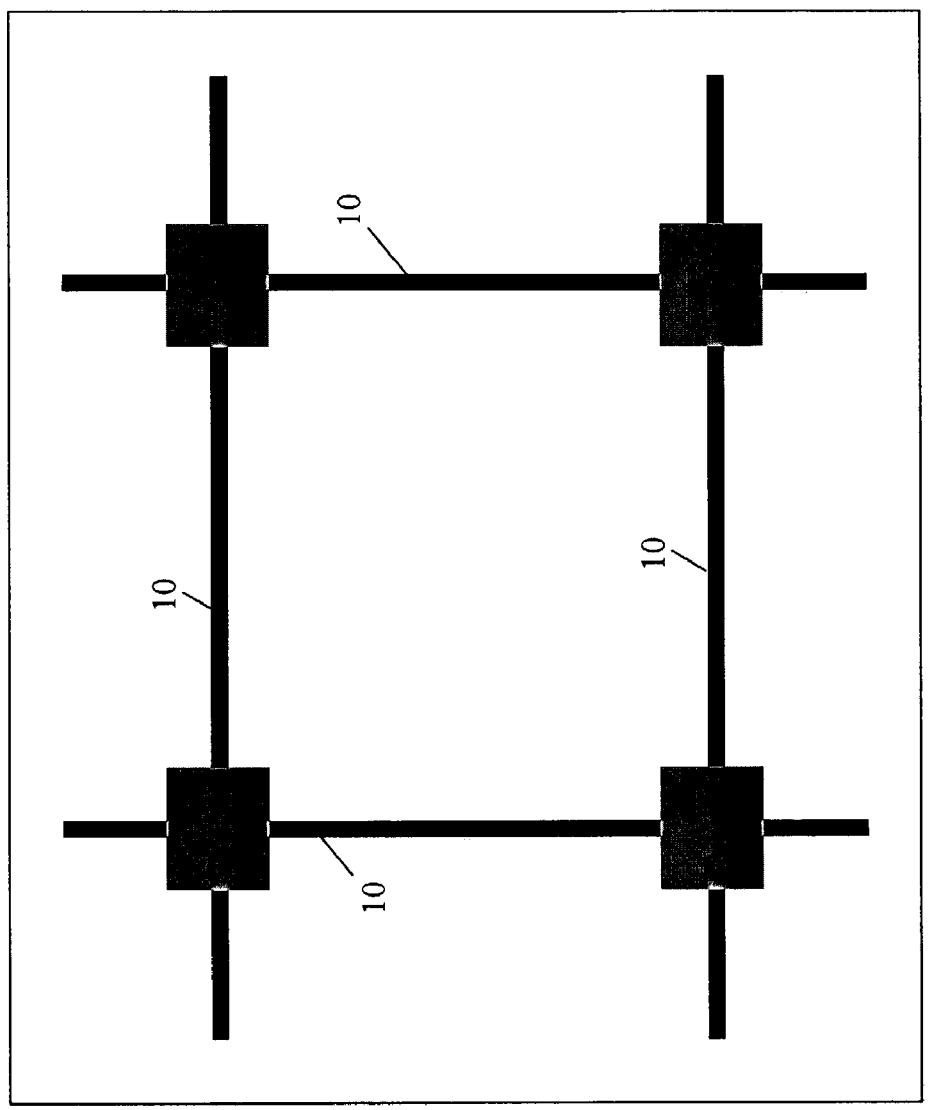
FIG. 1B is a top view of an array of electronic devices connected with stretchable interconnects having a flat profile.

FIGS. 1A-1B are schematic diagrams of stretchable interconnect 10 for electrically connecting electronic components 12, in accordance with the teachings of the present invention. Stretchable interconnect 10 can have a substantially buckled or wavy profile, as shown in FIG. 1A. The wavy profile is across the thickness of stretchable interconnect, for example in and out of the surface. Alternatively, stretchable interconnect 10 can have a substantially flat profile, as shown in FIG. 1B. Electronic component 12 can comprise electronic devices, thin film devices, sensors, circuit elements, control elements, microprocessors, transducers or any other desired electronic device as well as combinations of the foregoing. Stretchable interconnects 10 can be connected to respective contact pads 13 of two adjacent electronic components 12 for electrically coupling a contact of one device to a contact of another device. Electrical contact between stretchable interconnect 10 and device pad 13 of electronic component 12 can be achieved using any one of the techniques used in the fabrication and packaging of integrated circuits and printed wiring boards, such as metal evaporation, wire bonding, application of solids or conductive pastes. Stretchable interconnect 10 comprises a conductive film or conductive stripe formed on or embedded within a flexible substrate, as described below.

Figure 2A:
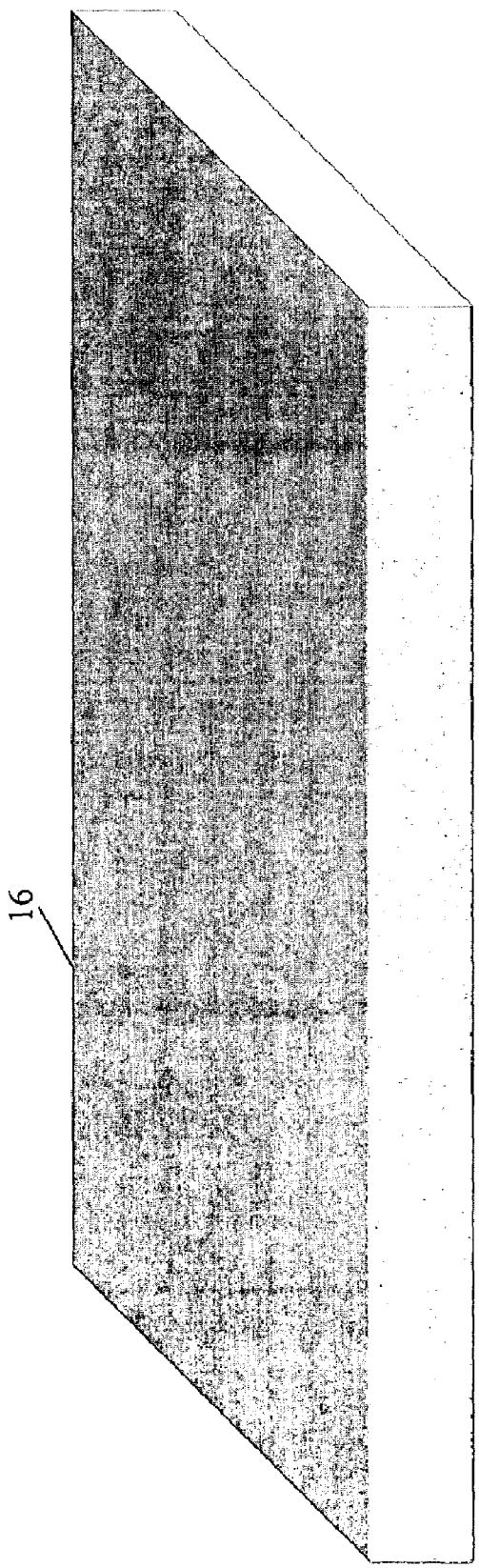
FIG. 2A is a perspective schematic diagram of a substrate prior to application of a conductive film.

In one aspect of the present invention, stretchable interconnect 10 is formed by covering flexible substrate 16 with conductive film 14, as shown in FIGS. 2A-2C. Substrate 16 can be an organic or inorganic material that can be stretched reversibly or stretched non-reversibly. A material which can be stretched non-reversibly can be deformed only once. Materials that can be stretched reversibly in order to be stretched and relaxed repeatedly are elastomeric, rubber-like. Elastomeric materials include carbon-based or silicon-based polymeric rubbers. Suitable elastomeric materials are silicone rubber, such as polydimethyl siloxane (PDMS) and acrylic rubber. Materials that can be deformed once include plastic materials. Suitable plastic materials include polyethylene terephthalate. Alternatively, substrate 16 can be formed of polymeric materials which are partly elastic and partly plastic. A suitable polymeric material is polyimide. The characteristic of the elastomeric or plastic material can depend strongly on temperature. Geometry of substrate 16 can be determined for a desired use. For example, substrate 16 can have a thickness of less than about 1 μm to about 1 cm and an area in the range of about 1 μm$^2$ to about 1 m$^2$ or more.

Conductive film 14 can comprise one or more layers of materials. Electrically conductive materials useful for conductive film 14 include metallic conducting materials such as copper, silver, gold, aluminum and the like. Alternatively, electrically conductive materials include organic conducting materials such as polyaniline. Suitable electrically conductive materials include a semiconductor, either inorganic like silicon or indium tin oxide, or organic-like pentacene or polythiophene. Alternatively, the electrically conductive materials can be alloys instead of stoichiometric elements or compounds. Conductive film 14 can be formed on substrate 16 by electron beam evaporation, thermal evaporation, sputter deposition, chemical vapor deposition (CVD), electroplating, molecular beam epitaxy (MBE) or any other conventional means. Conductive film 14 can be very thin of a mono or few atomic layers.

In one aspect, an electrically conductive material having adhesive properties to the substrate material is used singly or in combination with one or more additional layers, for example, a first conductive film 14a of chromium can be applied to substrate 16 as an adhesive layer and a second conductive film 14b of gold can be applied to the chromium layer. First conductive film 14a applied to substrate 16 as an adhesive layer can be a thin film having a thickness in the range of about 1 nm to about 100 nm, as shown in FIG. 2C. Second conductive film 14b applied to first conductive film 14a can be a thin film having a thickness in a range of about 1 nm to about 1000 nm.

In this aspect, stretchable interconnect 10 retains a flat profile after application of conductive film 14 to substrate 16. Stretchable interconnect 10 can be stretched along its length $L_1$ and/or its width $W_1$ and retain electrical conduction in both the length or width directions.

In another aspect, stretchable interconnect 10, formed by the above described method, has a wavy or buckled profile, as shown in FIGS. 3A-3B. For example, the profile can be buckled randomly or organized in waves with long-range periodicity. The wavy or buckled profile can be induced by compressive stress within conductive film 14 upon application of the film to substrate 16. The compressive stress can be a result of built in stress or thermal expansion mismatch or both.

Figure 4:
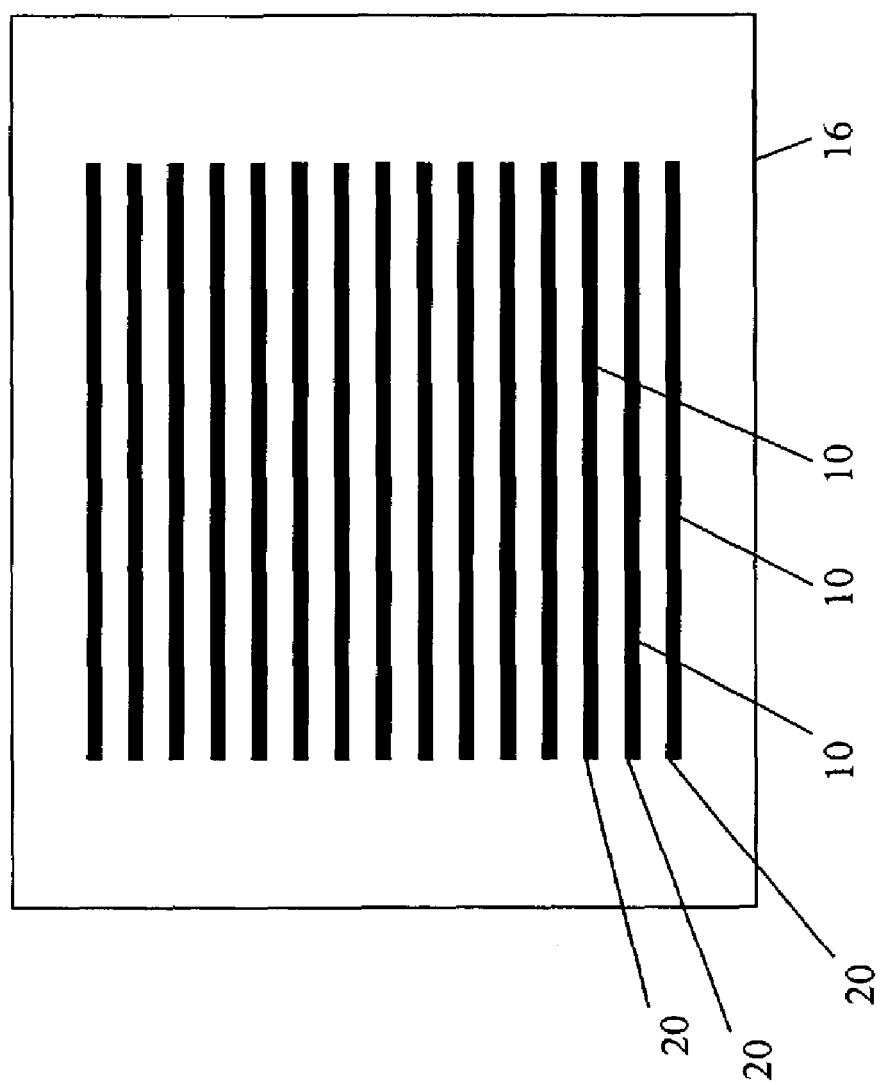
FIG. 4 is a top plan view of a plurality of stretchable interconnects formed as conductive stripes.

In another aspect, stretchable interconnect 10 is formed as conductive stripe 20 on substrate 16, as shown in FIG. 4. Conductive stripe 20 can have a width in the range of about 100 μm to about 2 nm or, alternatively, about 1 nm to about 1 m and a length determined by the desired application. For example, spacing between conductive stripes 20 can be the same as (the distance between stretchable interconnects) the width of the stretchable interconnects, shown in FIG. 1A. A conductive stripe can be formed in various patterns on the substrate. Conductive stripe 20 can be configured in conformance with overall interconnect geometry of a desired application.

Conductive stripe 20 is formed of a similar material as conductive film 14. Conductive stripe 20 can be formed by evaporating conductive film 14 through shadow mask 22, as shown in FIGS. 5A-5B. Shadow mask 22 can be formed of a compliant material, such as polyimide, a metal foil, for example, of bronze. Alternatively, photolithography and liftoff patterning can be used to form stripes 20, as shown in FIGS. 7A-7B. Photolithography with a positive photoresist mask 24 is used to pattern stripe 20 after metal evaporation. The thickness of photoresist mask 24 can be less, comparable or larger than the thickness of conductive stripe 20. Suitable positive photoresists are AZ5216 and Riston® (Dupont).

After development of the photoresist, metal regions no longer covered by the photoresist are removed by wet or dry etching. For example, stripes 20 can have a width the same or less than about 1 mm. Alternatively, lift-off patterning is performed prior to evaporation using negative photoresist. Stripes 20 are released by chemical stripping of the resist mask after the metal evaporation. Shadow mask 22 can have a thickness in the range of about 50 μm to about 1 mm which is one to six orders of magnitude thicker than the deposited conductor stripe. Shadow mask 22 is applied to substrate 16 prior to evaporation of conductive film 14 and is removed after evaporation of conductive film 14.

Figure 6A:
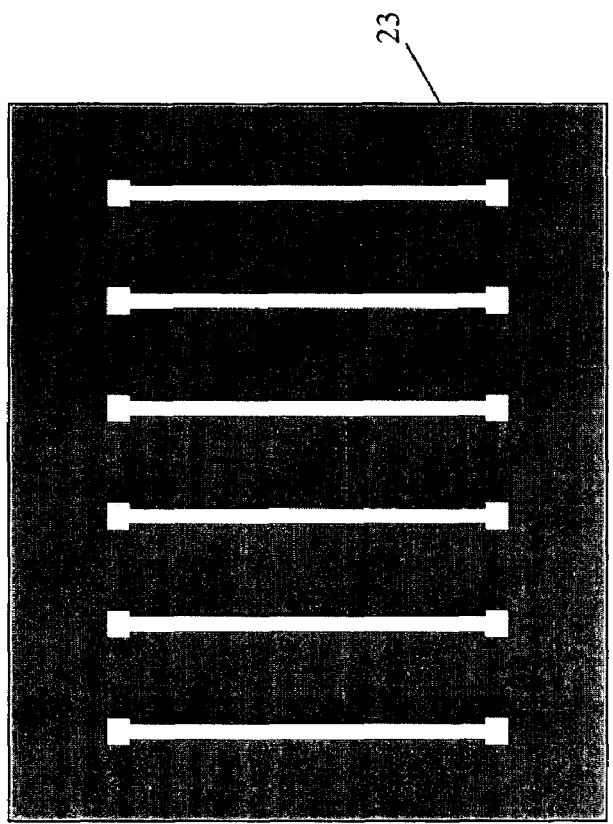
FIG. 6A is a top plan view of a rigid shadow mask used for forming conductive stripes.
Figure 6B:
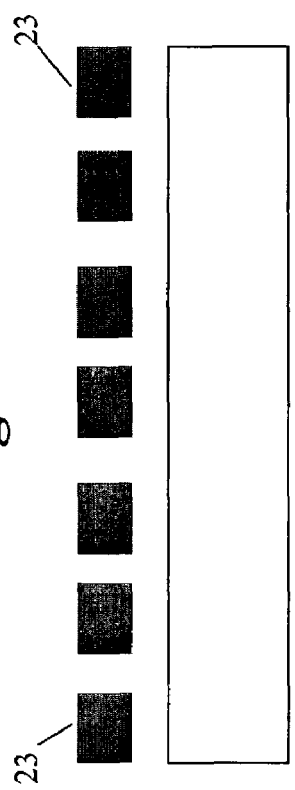
FIG. 6B is a cross-sectional view of the shadow mask shown in FIG. 6A.

Alternatively, shadow mask 22 can be formed of a rigid material, as shown in FIGS. 6A-6B. Suitable rigid material includes thick metal such as aluminum or bronze. Shadow mask 22 can have a thickness in the range of about 25 μm to about 5 mm which is one to six orders of magnitude thicker than a thickness of stripe 20 providing a smaller resolution of a width of stripe 20. Shadow mask 23 is mounted on top or apart from substrate 16 prior to evaporation of conductive film 14 and is released or removed after evaporation of conductive film 14.

Figure 8:
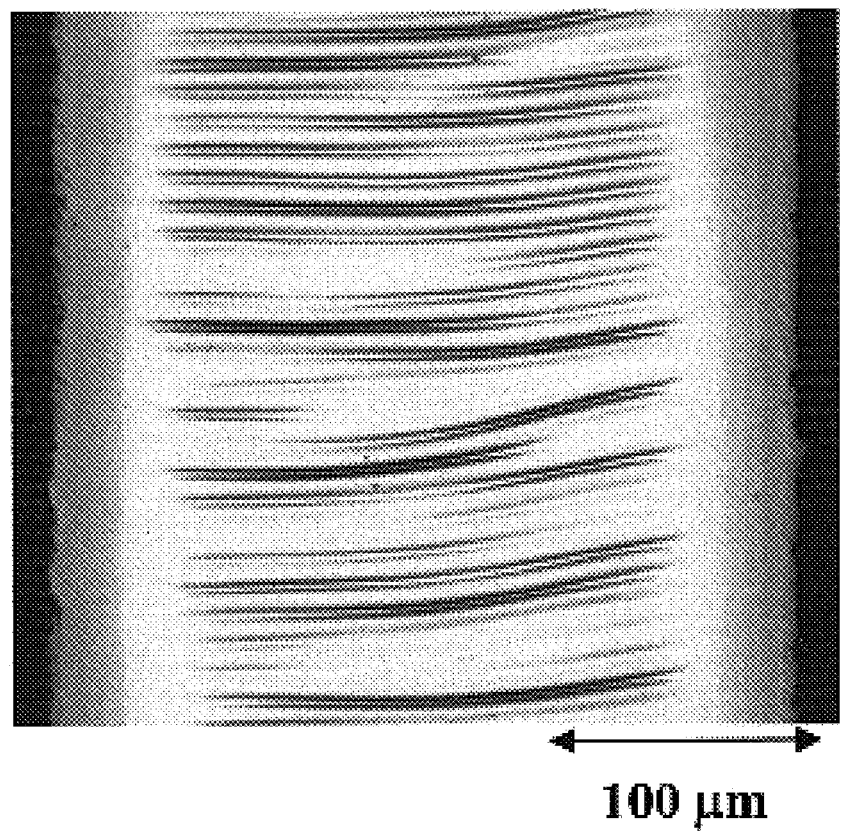
FIG. 8 is an optical image of a conductive stripe including a built-in wavy profile.

In an aspect of the present invention, stripes 20 can have a wavy or buckled profile formed as compressed stripes. For example, FIG. 8 illustrates surface waves formed on a 0.25 mm wide stripe.

Figure 9A:
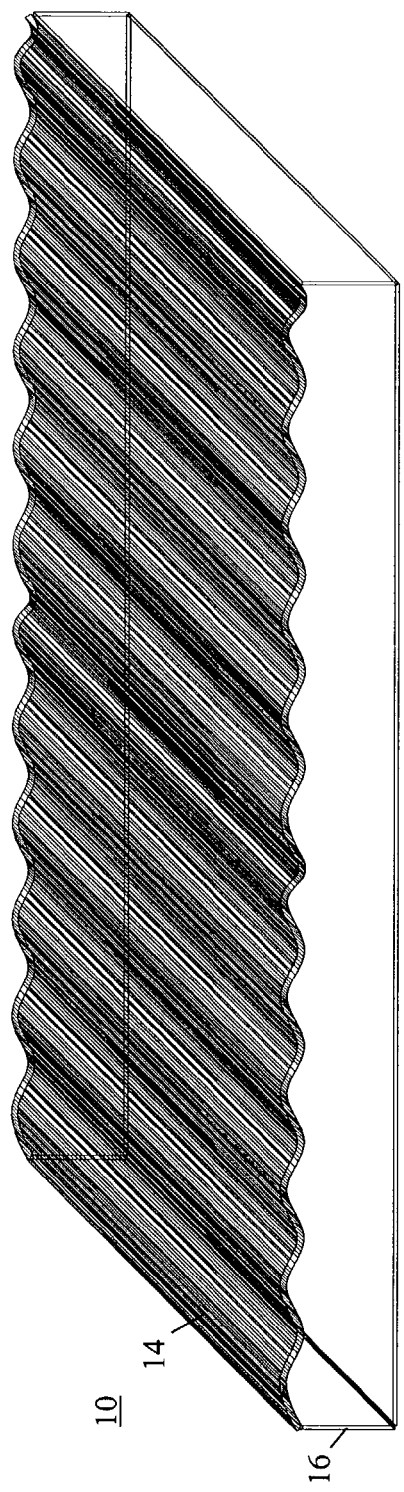
FIG. 9A is a perspective schematic view of a wavy interconnect substrate.
Figure 9B:
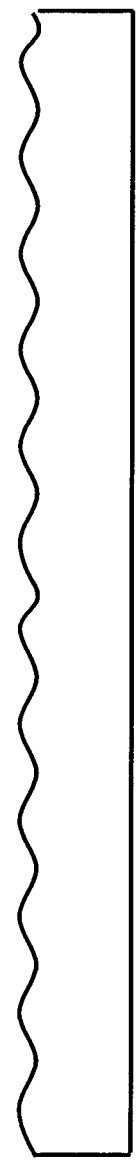
FIG. 9B is a side elevational view of a stretchable interconnect formed of the substrate of FIG. 9A.
Figure 9C:
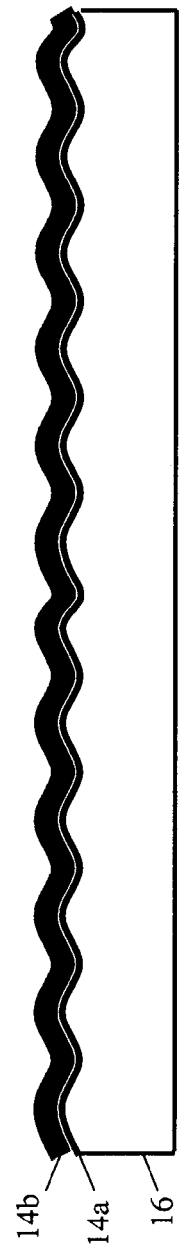
FIG. 9C is a side elevational view of FIG. 9A.

In another aspect of the present invention, stretchable interconnect 10 is formed on substrate 16 which has been prepatterned, as shown in FIG. 9A-9C. Substrate 16 is prepatterned to form a plurality of waves 40 in top surface 42 of substrate 16. Conductive film 14 is applied to prepatterned substrate 16 with methods as described above.

Figure 10A:
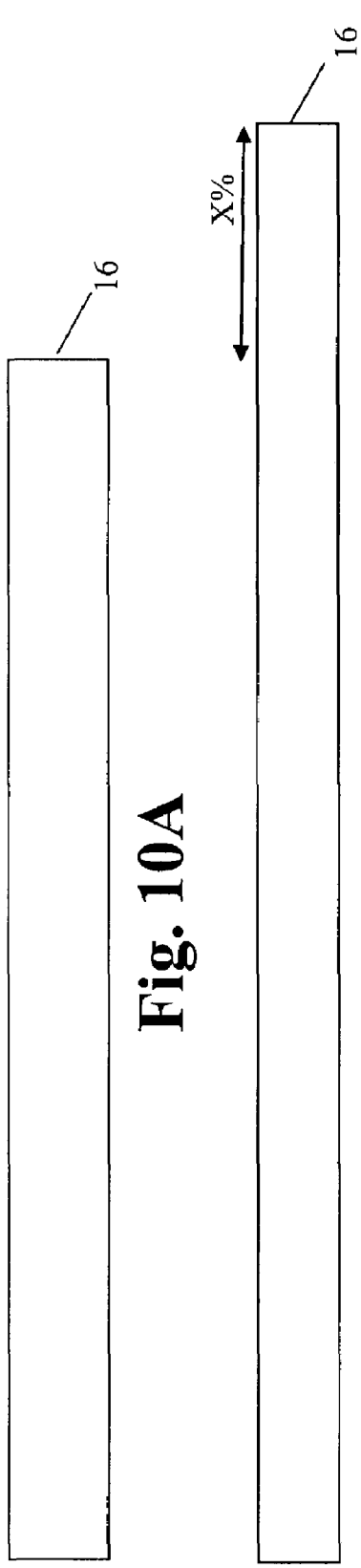
FIG. 10A is a side elevational view of a substrate used in forming a stretchable interconnect.
Figure 10B:
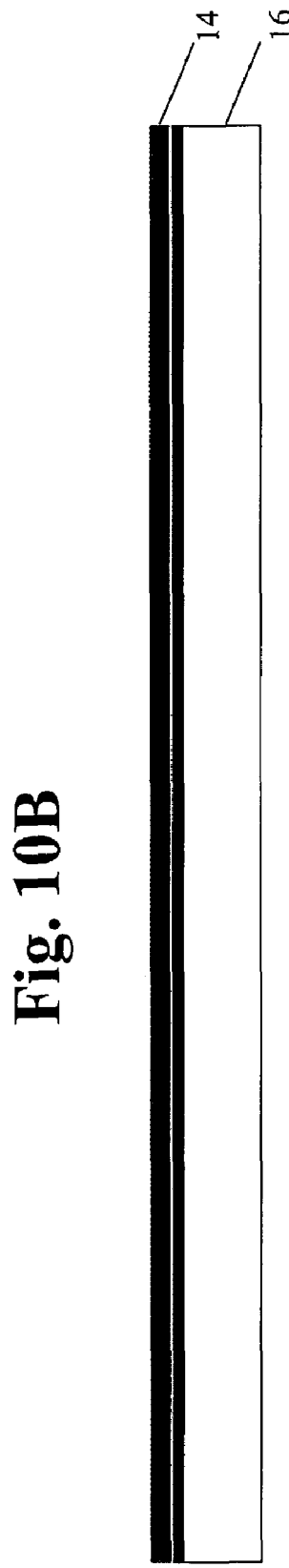
FIG. 10B is a side elevational view of the substrate after pre-stretching of the substrate by X % strain.
Figure 10C:
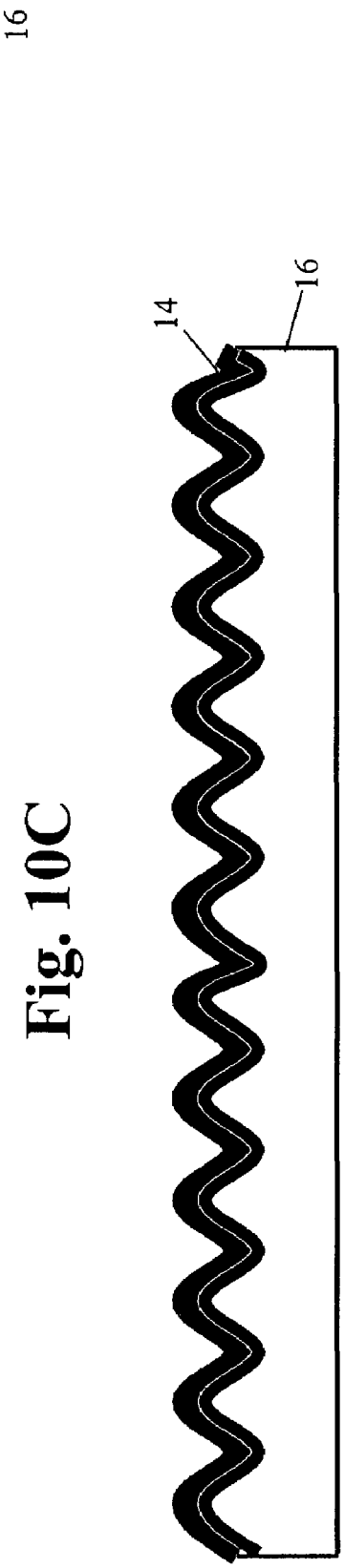
FIG. 10C is a side elevational view of a stretchable interconnect formed after application of a conductive film to the pre-stretched substrate.
Figure 10D:
FIG. 10D is a side elevational view of the wavy stretchable interconnect in a relaxed condition.

In another aspect of the present invention, stretchable interconnect 10 is formed by pre-stretching substrate 16 before application of conductive film 14, as shown in FIGS. 10A-10D. Substrate 16 is formed in FIG. 10A. Substrate 16 can be formed of a reversibly stretchable material, such as an elastomer. Substrate 16 is pre-stretched prior to evaporation by a predetermined pre-stretch percentage represented by X %, as shown in FIG. 10B. The pre-stretched percentage X % can be in the range of about 0.5% to about 500%, about 0.5% to about 50%, about 0.5% to about 100%. Conductive film 14 is applied to pre-stretched substrate 16 with techniques described above, as shown in FIG. 10C. After deposition of conductive film 14, substrate 16 is relaxed as shown in FIG. 10D. Stretchable interconnect 10 formed by this method has a wavy or buckled profile.

Stretchable interconnect 10 can be stretched as shown in FIGS. 11-13. In FIG. 11A, stretchable interconnect 10 is formed by the method of FIGS. 2A-2B. It has been found that stretchable interconnect 10a can be stretched by up to at least 100%, 50% and retain electrical conduction. It has been found that stretchable interconnect 10a retains electrical conduction upon formation of microcracks in a surface conductive film 14 upon stretching. It is believed that a thin layer of the conductive material remains at the interface of the conductor material and substrate to provide a continuous layer even if the surface of the film is discontinuous.

Figure 12A:
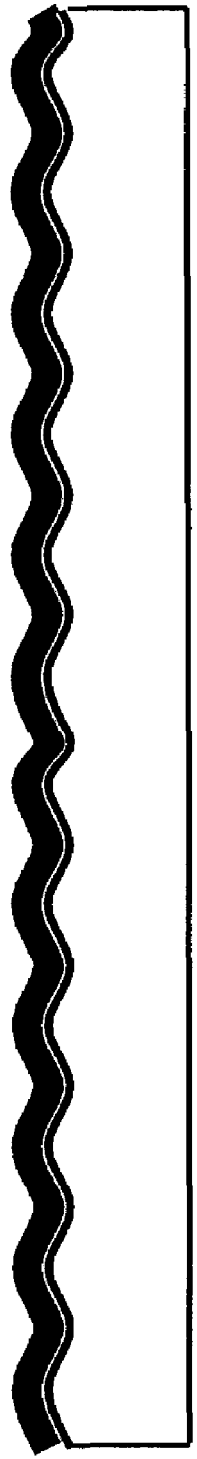
FIG. 12A is a side elevational view of a stretchable interconnect formed in accordance with FIGS. 3A-3B.
Figure 12B:
FIG. 12B is a side elevational view of the stretchable interconnect of FIG. 12A when stretched flat.
Figure 12C:
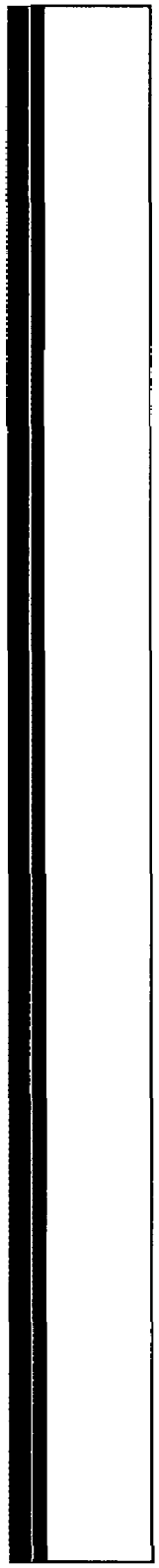
FIG. 12C is a side elevational view of the stretchable interconnect of FIG. 12B upon additional stretching.

In FIG. 12A, stretchable interconnect 10 is formed by the method of FIGS. 3A-3B. Stretchable interconnect 10b can be stretched flat by stretching substrate 16 up to about 0.5%, as shown in FIG. 12B. Thereafter, stretchable interconnect 10b can be stretched up to an additional about 500%, 100%, 50% and retain electrical conductivity, as shown in FIG. 12C.

Figure 13A:
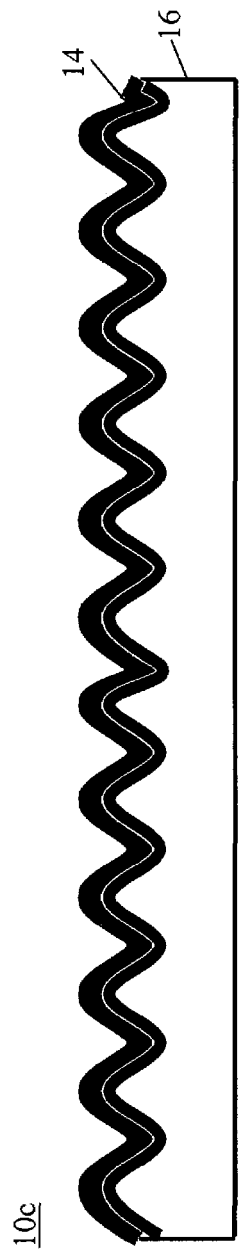
FIG. 13A is a side elevational view of a stretchable interconnect formed in accordance with FIGS. 10A-10D.
Figure 13B:
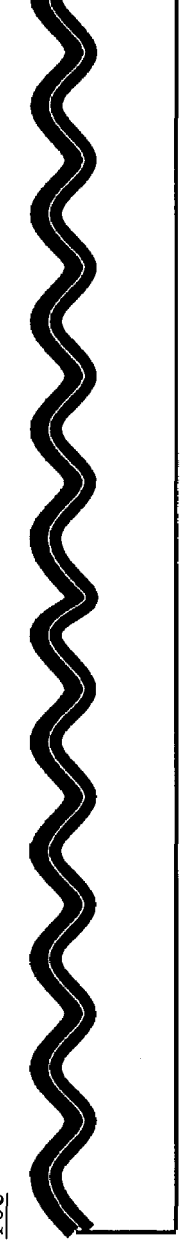
FIG. 13B is a side elevational view of the stretchable interconnect of FIG. 13A when stretched less than the initial pre-stretching (X %) percentage.
Figure 13C:
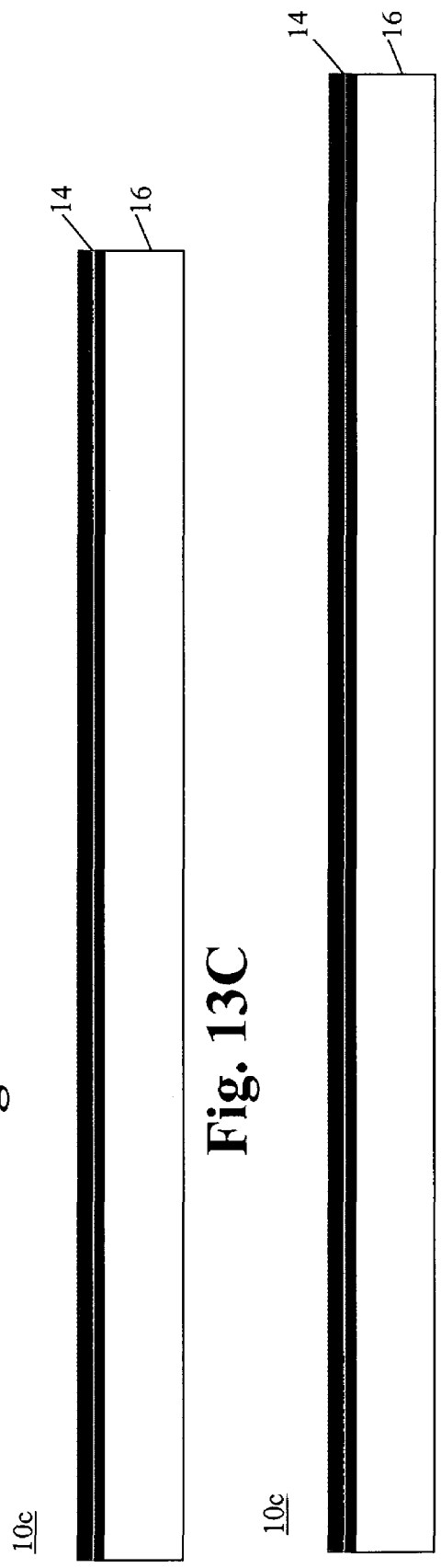
FIG. 13C is a side view of the stretchable interconnect of FIG. 13A when stretched flat at a value equal to the initial pre-stretched percentage.
Figure 13D:
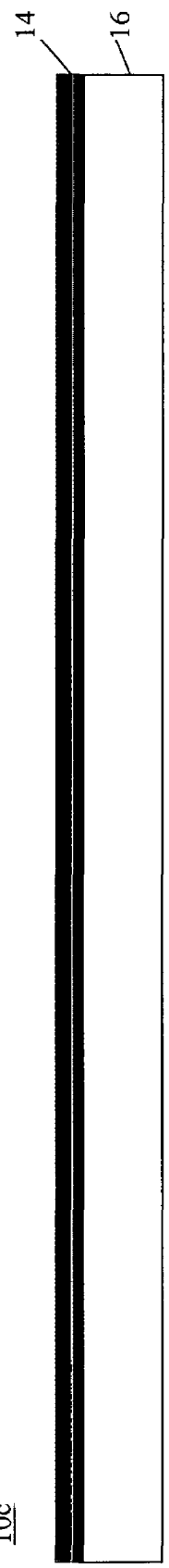
FIG. 13D is a side view of the stretchable interconnect of FIG. 13A when stretched to a greater value than the initial pre-stretched percentage.

In FIG. 13A, stretchable interconnect 10c is formed by the method of FIGS. 10A-10D. Stretchable interconnect 10c can be stretched less than the value of the prestretched percentage of X %, as shown in FIG. 13B. Thereafter, substrate 16 can be stretched to about the value of the pre-stretched percentage of X % to be stretched flat, as shown in FIG. 13C. Stretchable interconnect 10c can be further stretched a value several times greater than the pre-stretched percentage of X % and retain electrical conduction, as shown in FIG. 13D. For example, stretchable interconnect 10c can be stretched to a percentage from about 5 to about 50%, to about 100%, to about 500% and retain electrical conduction.

In another aspect of the invention, stretchable interconnect 10 is formed as films or stripes which can be embedded within substrate 16, as shown in FIGS. 14A-14B. Films or stripes embedded within substrate 16 can have a flat or wavy profile. Openings 40 can be formed in substrate 16. Electrical contacts to electronic devices can access stretchable interconnect 10 through opening 40.

Figure 15A:
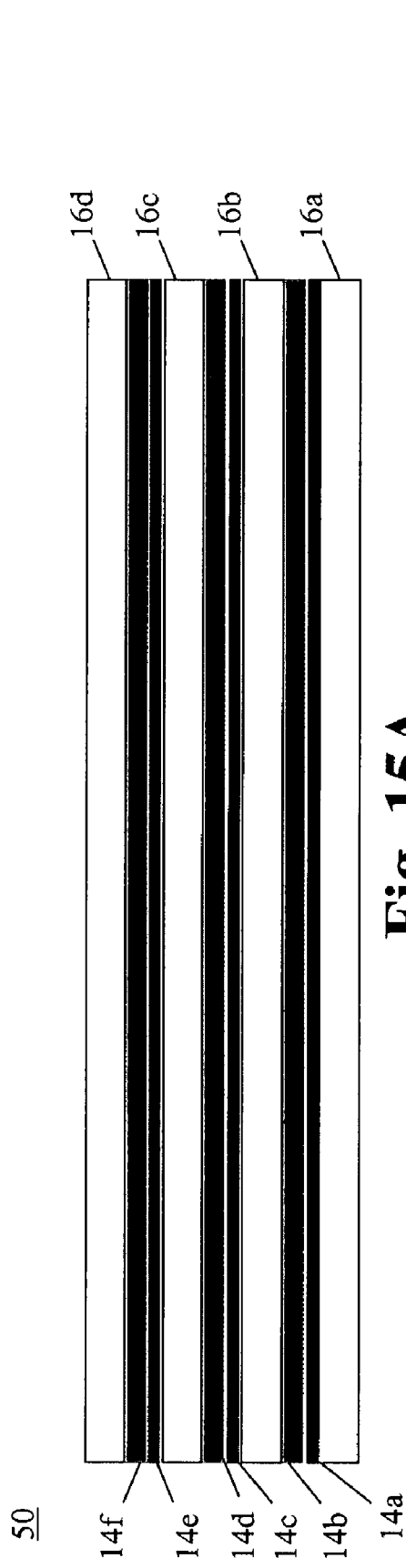
FIG. 15A is a side elevational view of a stack of stretchable interconnects where each layer has a flat profile.

In various embodiments of the present invention, a plurality of layers of conductive film 14 or stripe 20 are embedded between a plurality of layers of substrate 16. In one embodiment shown in FIG. 15A, stack of stretchable interconnects 50 is formed by embedding a plurality of layers of conductive film 14a-f within a plurality of layers of substrate 16a-16d, using a similar method as described for FIGS. 2A-2C. Conductive film 14a is applied to substrate 16a. Conductive film 14b is applied to conductive film 14a. Substrate 16b is applied to conductive film 14b. Conductive film 14c is applied to substrate 16b. Conductive film 14d is applied to conductive film 14c. Substrate 16c is applied to conductive film 14e. Substrate 16c is applied to conductive film 14d. Conductive film 14e is applied to substrate 16c. Conductive film 14f is applied to conductive film 14e. Substrate 16d is applied to conductive film 14f.

Figure 15B:
FIG. 15B is a side elevational view of the stack of stretchable interconnects of FIG. 15A when stretching.

Stack of stretchable interconnects 50 can be stretched as shown in FIG. 15B. Each of substrates 16a-16d and conductive films 14a-14f are stretched uniformly to provide a uniformly stretched stack of films.

In an alternate embodiment, a plurality of layers of conductive film are embedded between a plurality of layers of substrate 16, as shown in FIGS. 16A-16C. Stack of stretchable interconnects 60 is formed by embedding a plurality of layers of conductive film 14a-14f within a plurality of layers of substrate 16a-16d using similar methods as described for FIGS. 3A-3B and FIGS. 10A-10D. In one aspect, layers of substrate 16a-16d can be pre-stretched to a pre-stretched percentage of X %. Conductive film 14a is applied to substrate 16a. Conductive film 14b is applied to conductive film 14a. Substrate 16b and 16c are applied to respective conductive film 14b and 14d. Conductive films 14c and 14e are applied to respective substrates 16b and 16c. Conductive films 14d and 14f are applied to respective conductive films 14c and 14e. Substrate 16d is applied to conductive film 14f. Stack of stretchable interconnects 60 has a wavy or buckled profile.

In one embodiment, stack of thin films 60 is formed by embedding a plurality of layers stripes 20a-20f within a plurality of layers of substrate 16a-16d. Buckling or waves of stripes 20 can be induced by built-in compressive stress.

Stack of stretchable interconnects 60 can be stretched to a value below the prestretched percentage X %, as shown in FIG. 16B. Stack of stretchable interconnects 60 can be stretched to a value greater than the pre-stretched percentage X % and each of substrates 16a-16d and conductive films 14a-14f are stretched uniformly to provide a uniformly stretched stack of films.

In various embodiments, stretchable interconnects 10 formed as conductive stripes 20 can be formed in different directions on substrate 16, as shown for example in FIGS.

Figure 17:
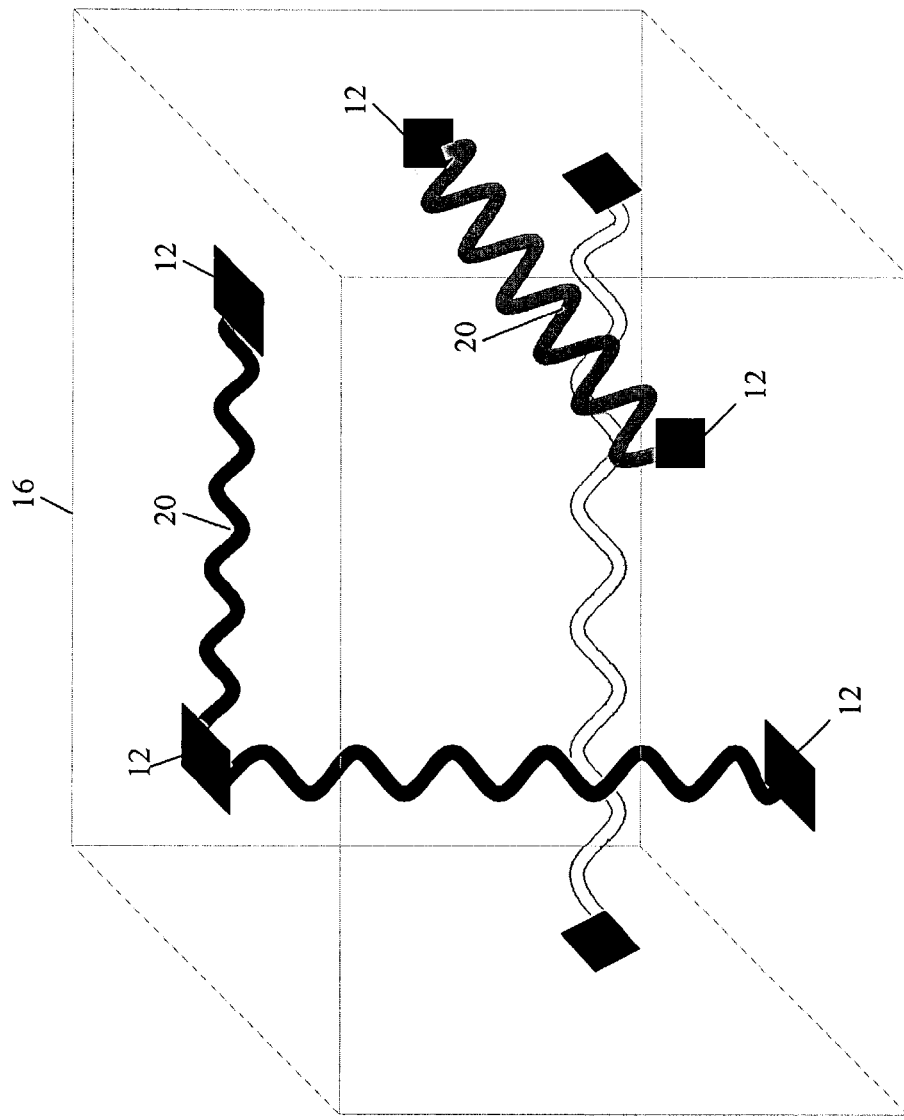
FIG. 17 is a schematic view of stretchable interconnects mounted in a substrate.

1A-1B. Alternatively, stretchable interconnects 10 formed as conductive stripes 20 can be embedded within substrate 16 as a single layer or in a plurality of layers. In other embodiments, stretchable interconnects can be formed of conductive films 14 or conductive stripes 20 and can be oriented in X, Y and Z directions on substrate 16 or embedded within substrate 16, as shown in FIG. 17.

The invention can be further illustrated by the following examples thereof, although it will be understood that these examples are included merely for purposes of illustration and are not intended to limit the scope of the invention unless otherwise specifically indicated. All percentages, ratios, and parts herein, in the Specification, Examples, and Claims, are by weight and are approximations unless otherwise stated.

EXAMPLES

Preparation of Substrates

1. Elastomer substrates were prepared by mixing a polymer base with curing agents in a controlled weight ratio. Sylgard 184 silicone elastomer was used as a compliant substrate. The controlled weight ratio was 10:1 for the Sylgard 186 silicone rubber. Substrates about 0.5 mm to 1 mm thick were prepared in a dish and cured several hours in a controlled temperature oven. The curing time and temperature depend on the polymer. The Sylgard 184 substrates used were 1-mm thick and were cured at 60° C. for at least 12 hours after de-airing.

2. Thin elastomer substrates tens of a micrometer thick can be prepared by spin casting onto a rigid holder, such as a glass slide or a silicon wafer and cured afterwards. Thin elastomer substrates can also be prepared by pre-stretching millimeter thick elastomer films.

3. Plastic substrates are commercially available in a wide range of thicknesses.

Preparation of Conductive Film

A conductive film of a metallic bi-layer of chromium (Cr) and gold (Au) was prepared by e-beam evaporation in a Denton/DV-502A evaporator. The base pressure in the chamber was $4 \times 10^{-6}$ torr prior to the evaporation and $8 \times 10^{-6}$ torr during evaporation. The Au deposition rate was ~2 Å/s. The temperature of the sample holder does not exceed 50° C. during the metal evaporation. In a single run, a 5 nm thick bonding layer of chromium and then a layer of Au were evaporated onto the substrate. Different Au film thicknesses were selected in the 25-100 nm range. It was found that a layer of Au thicker than 100 nm was not stretchable.

Results

1. Stretching of Conductive Film

Figure 18:
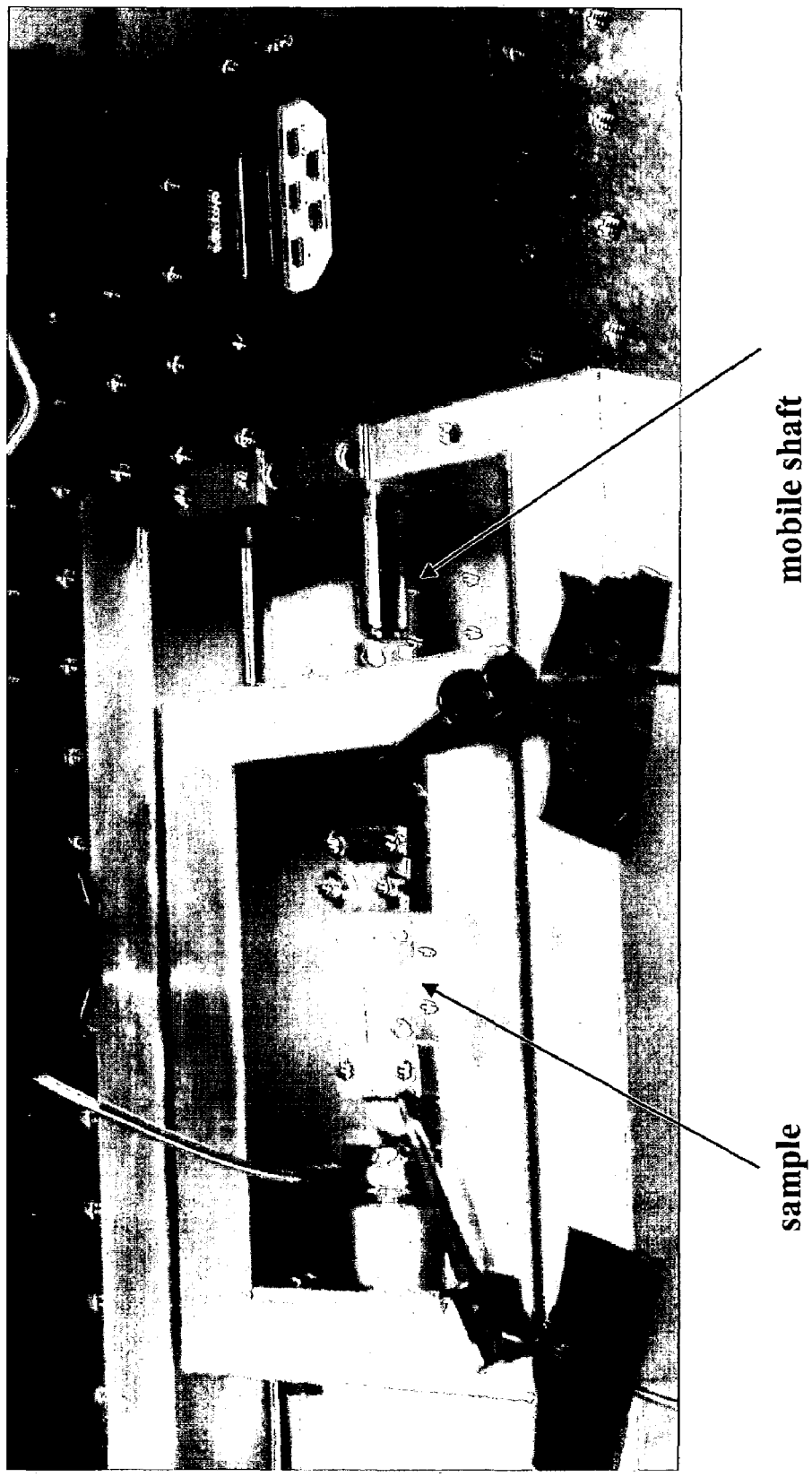
FIG. 18 is a pictorial view of a combined strain and electrical resistance tester used to record the electromechanical behavior of the stretchable interconnect.
Figure 19:
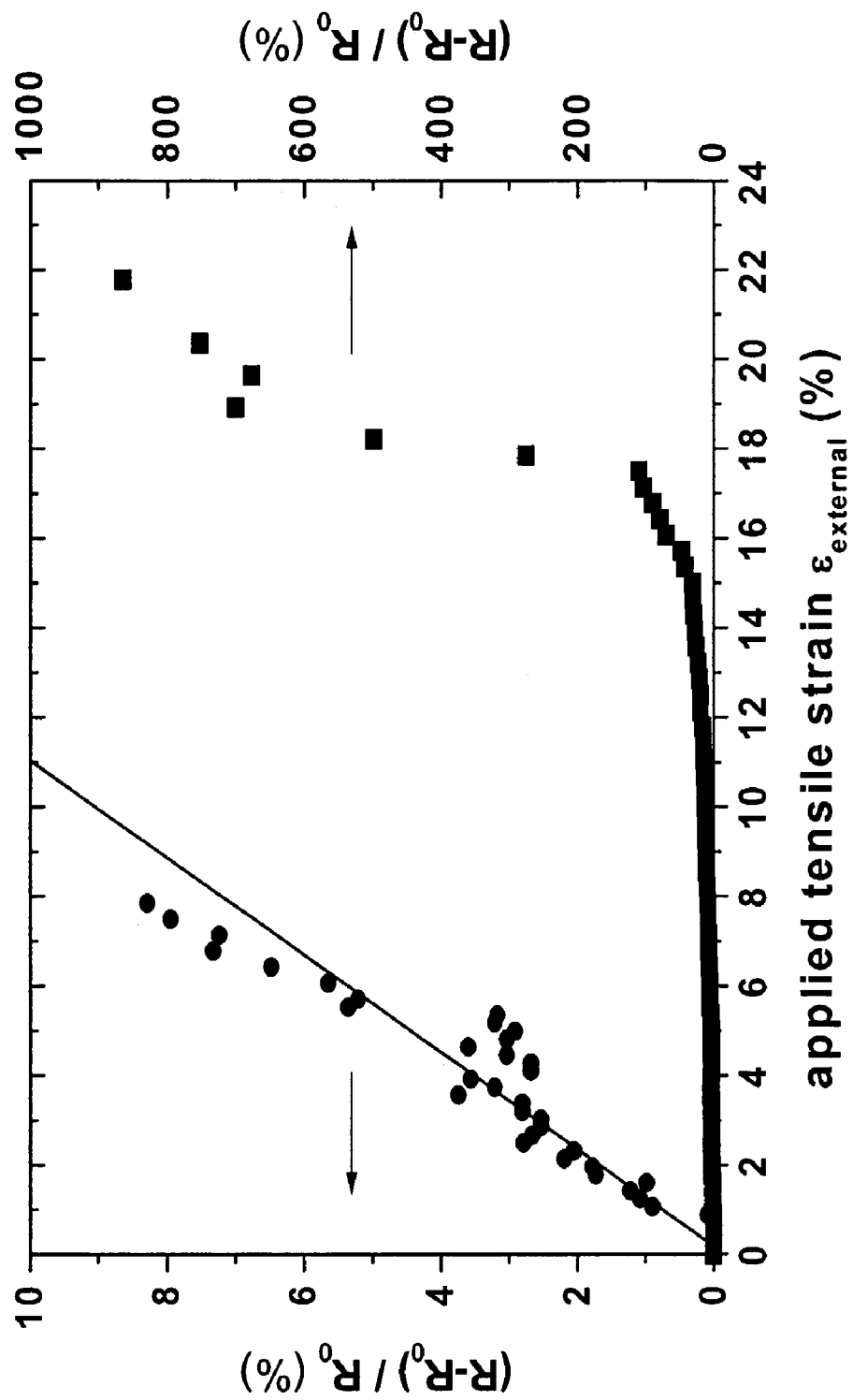
FIG. 19 is a graph of the variation of the normalized change in electrical R of an interconnect with applied tensile strain.

Electrical resistance of stretchable interconnect 10 while under mechanical strain was evaluated. Electrical contact of conducting epoxy paste were applied, and 0.1 mm diameter gold wires were embedded in the paste. The paste burying the wires was sandwiched between substrate 16 formed of PDMS and applied conductive stripe 20 and a second piece of PDMS to ensure electrical connection as well as mechanical compliance. A sample is shown in FIG. 18 mounted under a microscope in a strain tester and with electrical leads. Conductive stripe 20 was formed of Au and is 100 nm thick, 28 mm long and 0.25 mm wide. The electrical resistance as a function of uniaxial strain was measured in situ using a Keithley 4210 source meter. The lengthening of the sample and eventual development of cracks in the Au stripe were recorded with an Infinity Long Distance K2 microscope, a Kodak digital camera, and an XYZ translation platform. The elongation was measured with a 1 µm resolution Mitutoyo meter. From this elongation $L-L_0$, the values of externally applied strain $\epsilon_{external} = (L-L_0)L_0$ are calculated from the difference of the sample length, L to its unstressed length, $L_0$. The electrical resistance was first measured without external strain. Then the sample was elongated, first in 0.18% steps of X % and beyond X %=6% in 0.36% steps, and was held for 5 minutes at each strain value. FIG. 19 presents the change in electrical resistance $(R-R_0)/R_0$ normalized to its initial value as shown in curve 80 with applied tensile strain. Curve 82 represents the linear behavior of $(R-R_0)/R_0$ for strain lower than 8%.

After mounting in the test frame and in the absence of externally applied strain, the Au stripe of FIG. 19 was buckled as shown in FIG. 8. The surface of the sample became flat after the first two 0.18% steps=0.36% external strain were applied; it was free of cracks. Because the calculated critical strain $\epsilon_c$ is only 0.015%, the initial compressive strain in the gold film $\epsilon_0$ is near 0.36%.

Figure 20A:
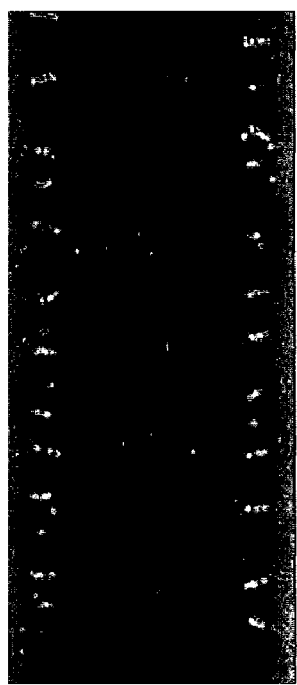
FIG. 20A is a photograph of a stretchable interconnect under a 8% tensile strain.
Figure 20B:
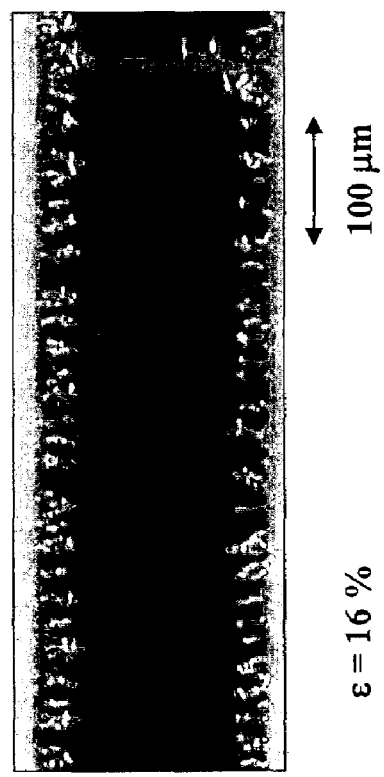
FIG. 20B is a photograph of a stretchable interconnect under a 16.4% tensile strain.

Resistance under tension was measured. It was expected to reach a maximum value of tensile strain in the electrically continuous film of ~1%. FIG. 19 shows that, surprisingly, the Au line remains conducting under $\epsilon_{external}$ much above this typical fracture strain of a free-standing thin film. FIG. 19 exhibits two regimes. At strains lower that ~8% $(R-R_0)/R_0$ is proportional to elongation. In this regime small cracks appear at the edges of the stripe as shown in FIG. 20A. FIG. 20A is a photograph of a 100 nm Au stripe on a 1 mm thick substrate of PDMS at a 8% tensile strain. At higher strain cracks extend across much of the width of the stripe, perpendicular to its long dimension and visible in FIG. 20B. FIG. 20B is a photograph of a 100 nm Au stripe on a 1 mm thick substrate of PDMS at a 16% tensile strain. These longer cracks cause a pronounced rise of the electrical resistance. At strains above 15%, these cracks traverse the full width of the Au line. It has been found that while the electrical resistance rises drastically, it remains finite. This observation suggests that the film is broken, but that a thin conductive layer remains at the bottom of the cracks. From the crack dimensions it is estimated that this conducting remnant layer is one metal atom thick. At $\epsilon_{external}$=23% the resistance became infinite.

2. Bending of Conductive Film

Five samples were prepared on a 1-mm thick PDMS substrate with thickness from 25 to 400 nm, in accordance with the technique of FIGS. 2A-2C. All Au layers are flat.

Figure 21:
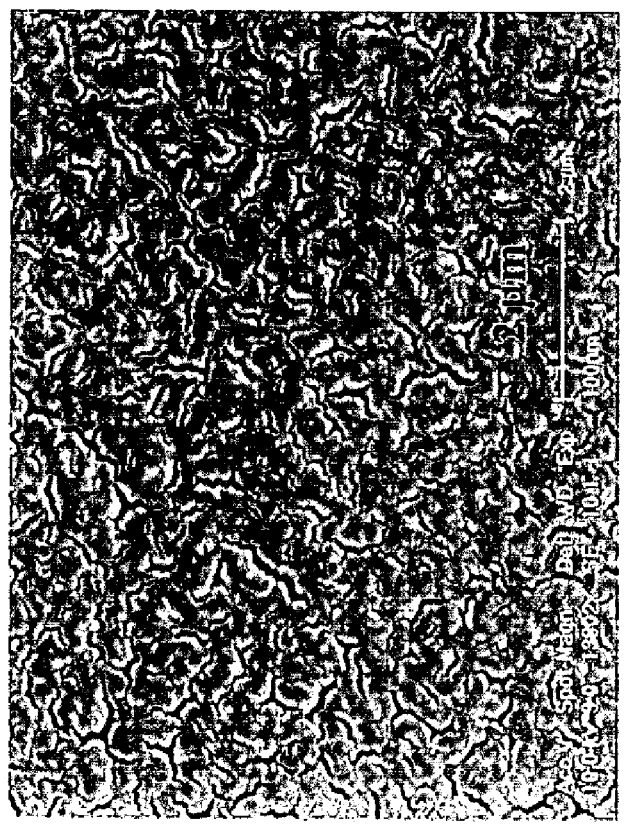
FIG. 21 is a scanning electronic micrograph of a stretchable interconnect formed in accordance with FIGS. 2A-2C.

The initial electrical resistance $R_0$ was measured for each film before deformation. All samples conduct but their resistance is higher than the value $R_{th}$ calculated from the dimension of the Au stripes by at least one order of magnitude. The surface topography was analyzed by scanning electron micrographs (SEM). FIG. 21 shows the surface of a 100 nm thick Au sample. It is shown that the Au layer, which appeared smooth under the optical microscope contains a network of tiny cracks. Each crack is Y-shaped, about 1 µm long and 50 to 100 nm wide. It is shown that the cracks are not connected to each other. The micro-cracks appear immediately after the gold evaporation and are found on all samples. The high initial resistance values can be a result of the presence of the micro-cracks running in the Au film. The cracks increase the electrical length of the line and shrink the layer cross section.

Figure 22:
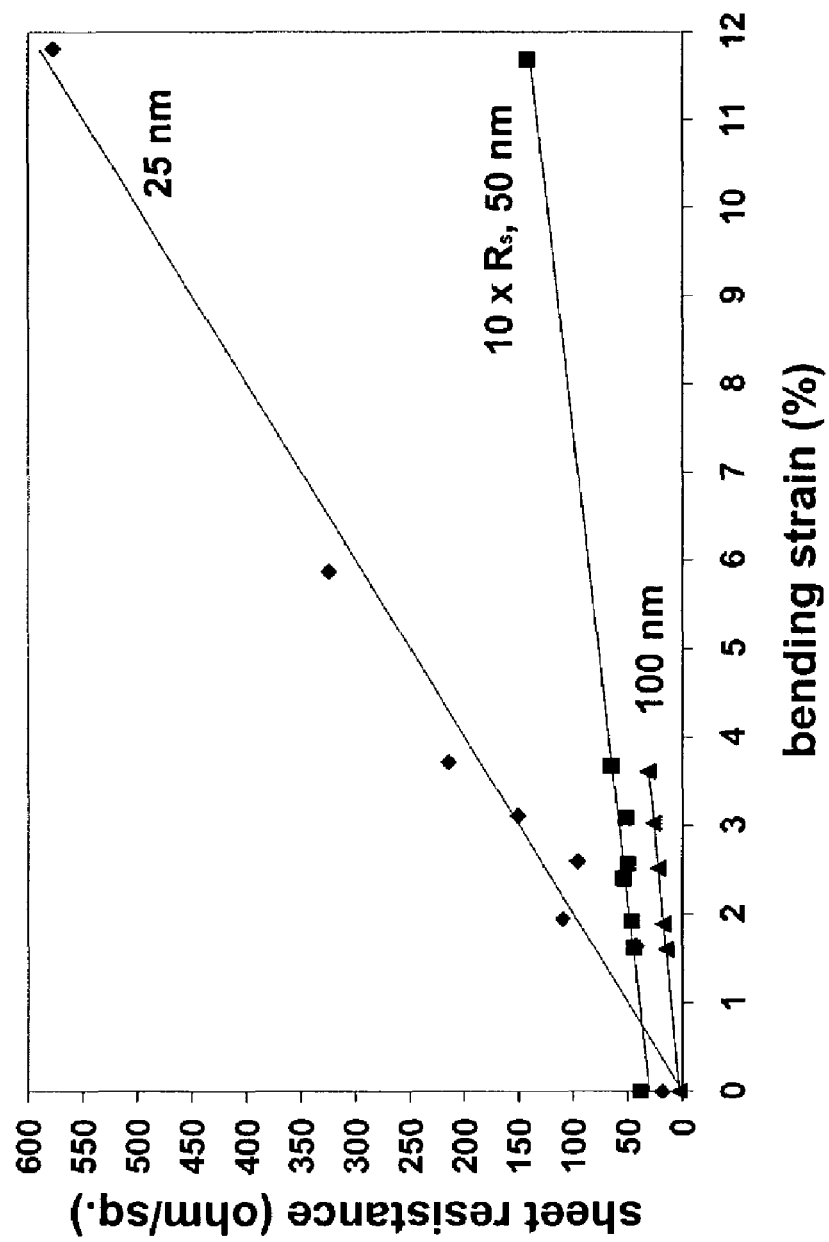
FIG. 22 is a graph of an electrical resistance versus bending strain for three thicknesses of a conductive film.

The electrical resistance of the Au line was recorded as a function of bending strain with the following protocol: each sample placed on a curved tube section for 30 min and its resistance is measured, then the sample is laid flat for another 30 min and its resistance is recorded. Then the sample is placed on a tube with a smaller radius for larger strain. The results for three Au thicknesses of 25 nm, 50 nm and 100 nm are shown in FIG. 22 as the sheet resistance $R_s$ in $\Omega/\square$ is plotted versus the strain induced by bending.

It was found that in Au films thicker than 100 nm at tensile strain higher than 1%, transversal cracks formed across the sample and cut the electrical path. Samples thinner than 100 nm remained electrically conducting for strains much beyond the typical fracture strain of thin metal film of ~1%. 25 and 50 nm thick samples remained conducting at strain of up to 12%. It was found that in all cases, the resistance increases linearly with strain.

Figure 23:
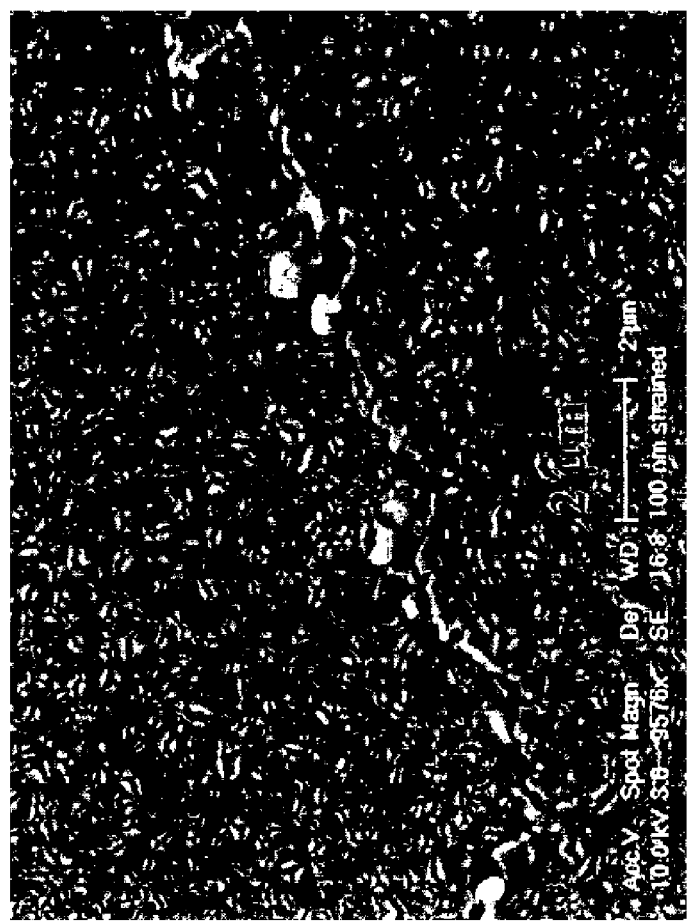
FIG. 23 is a scanning electronic micrograph of a stretchable interconnect formed in accordance with FIGS. 2A-2C after bending to 4%.

FIG. 23 shows a portion of the 100 nm thick sample after 4% tensile deformation. It is shown that large cracks appear during bending. The large cracks are hundreds of μm long and form perpendicularly to the straining direction. The small cracks described above remain. During elongation, some of the small cracks are observed to merge and propagate but do not extent over the entire width. The electrical resistance remains finite.

Between each tensile deformation, the Au stripe is let to relax for 30 min while flat. The "flat" electrical resistance is then recorded. It was found that less than 5% scatter, except for the 25-nm thick sample. During relaxation, the elastic PDMS substrate pulls the cracks close, and film fragments at the edges of the cracks tend to overlap. The electrical resistance recovers a value close to its initial one. Accordingly, the response of electrical resistance to tensile deformation is reversible.

It is to be understood that the above-described embodiments are illustrative of only a few of the many possible specific embodiments which can represent application so the principles of the invention. Numerous and varied other arrangements can be readily devised in accordance with these principles by those skilled in the art without departing from the spirit and scope of the invention.

We claim:

1. A stretchable electrical conductor for electronically and mechanically connecting electronic components of devices in a longitudinal (x), lateral (y) and transversal (z) axis system, comprising:

a stretchable substrate placed in the longitudinal, lateral, transversal axis system, said substrate being prestretched along one axis of the system, or prestretched along two axis of the system, or prestretched along all three axis of the system to be substantially flat, said substrate is an elastomeric material, said substrate can be stretched reversibly along one or any axis of the system and has a thickness in the range of about 1 μm to about 1 cm; and an electrically conductive material formed on or embedded within said substrate said conductive material comprises a conductive metallic film or conductive metallic stripe having a thickness in the range of about 1 nm to about 1000 nm, said conductive metallic film or said conductive metallic stripe is formed on the elastomeric substrate with its longitudinal axis aligned with the longitudinal axis of the substrate, or with its longitudinal axis aligned with the lateral axis of the substrate, or with its longitudinal axis at an arbitrary angle to the longitudinal axis of the substrate, said conductive metallic film or said conductive metallic stripe is embedded in the elastomeric substrate and oriented with its longitudinal axis aligned with the longitudinal axis of the substrate, or with its longitudinal axis aligned with the lateral axis of the substrate, or with its longitudinal axis at an arbitrary angle to the longitudinal axis of the substrate, or with its longitudinal axis aligned with the transversal axis of the substrate said conductive metallic film or said conductive metallic stripe expanding along the longitudinal axis of the substrate, or along the lateral axis of the substrate and/or in any direction at an arbitrary angle to the longitudinal axis of the substrate and/or lateral axis of the substrate, or along the transversal axis of the substrate, said conductive metallic film or said conductive metallic stripe providing stretchability simultaneously in any direction in the longitudinal/lateral plane of the substrate, or in any direction in the longitudinal/transversal plane of the substrate, or any direction in the lateral/transversal plane of the substrate or said conductive metallic film or said conductive metallic stripe providing stretchability simultaneously in any directions of the longitudinal (x), lateral (y), and (z) transversal axis system wherein said conductive material extends between two of said devices for electronically coupling a contact of one device to a contact of another device and said stretchable electrical conductor is capable of being stretched up to a predetermined percentage in any planar and non-planar direction and retain electrical conductivity wherein said conductive material formed on or embedded with said stretchable substrate has a wavy or buckled profile after release of said prestretched substrate.

2. The stretchable electrical conductor of claim 1 wherein said predetermined percentage is determined by said stretchable electrical conductor being first stretched flat up to about 0.5% strain and second stretched to an amount up to about 100% strain in any direction.

3. The stretchable electrical conductor of claim 1 wherein said conductive metallic film is formed on said substrate.

4. The stretchable electrical conductor of claim 1 wherein said conductive metallic film is embedded within said substrate.

5. The stretchable electrical conductor of claim 1 wherein said conductive material is selected from the group consisting of copper, silver, gold and aluminum.

6. A stretchable electrical conductor for electronically and mechanically connecting electronic components of devices in a longitudinal (x), lateral (y), transversal (z) axis system, comprising:

a stretchable substrate placed in the longitudinal (x), lateral (y), and (z) transversal axis system, said substrate being substantially flat said substrate is an elastomeric material said substrate can be stretched reversibly along one or any axis of the system and has a thickness in the range of about 1 μm to about 1 cm; and an electrically conductive material formed on or embedded within said substrate said conductive material comprises a conductive metallic film or conductive metallic stripe having a thickness in the range of about 1 nm to about 1000 nm, said conductive metallic film or said conductive metallic stripe is formed on the elastomeric substrate with its longitudinal axis aligned with the longitudinal axis of the substrate, or with its longitudinal axis aligned with the lateral axis of the substrate, or with its longitudinal axis at an arbitrary angle to the longitudinal axis of the substrate, said conductive metallic film or said conductive metallic stripe is embedded in the elastomeric substrate and oriented with its longitudinal axis aligned with the longitudinal axis of the substrate, or with its longitudinal axis aligned with the lateral axis of the substrate, or with its longitudinal axis at an arbitrary angle to the longitudinal axis of the substrate, or with its longitudinal axis aligned with the transversal axis of the substrate, said conductive metallic film or said conductive metallic stripe expanding along the longitudinal axis of the substrate, or along the lateral axis of the substrate and/or in any direction at an arbitrary angle to the longitudinal axis of the substrate and/or lateral axis of the substrate, or along the transversal axis of the substrate, said conductive metallic film or said conductive metallic stripe providing stretchability simultaneously in any direction in the longitudinal/lateral plane of the substrate, or in any direction in the longitudinal/transversal plane of the substrate, or any direction in the lateral/transversal plane of the substrate, or said conductive metallic film or said conductive metallic stripe providing stretchability simultaneously in any directions of the longitudinal (x), lateral (y) and transversal axis system wherein said conductive material extends between two of said devices for electronically coupling a contact of one device to a contact of another device and said stretchable electrical conductor is capable of being stretched up to a predetermined percentage in any planar and non-planar direction and retain electrical conductivity wherein upon forming said conductive stripe on said stretchable substrate, said substrate has a flat profile.

7. The stretchable electrical conductor of claim 6 wherein said conductive film or said conductive strip is formed of a first metallic material adhering to said substrate and a second metallic material adhering to said first metallic material.

8. The stretchable electrical conductor of claim 6 wherein said substrate is selected from the group consisting of: silicone rubber such as polydimethyl siloxane (PDMS) and acrylic rubber.

9. The stretchable electrical conductor of claim 6 wherein said conductive material comprises the conductive stripe.

10. The stretchable electrical conductor of claim 9 wherein said conductive stripe has a width in the range of about 1 nm to about 1 m.

11. The stretchable electrical conductor of claim 9 wherein said conductive metallic stripe is formed on said substrate.

12. The stretchable electrical conductor of claim 9 wherein said conductive metallic stripe is embedded within said substrate.

13. The stretchable electrical conductor of claim 12 further comprising openings formed in said substrate, wherein said contact of said device and said contact of another device access said stretchable electrical conductor through said openings.

14. The stretchable electrical conductor of claim 6 wherein said predetermined percentage is up to about 100%.

15. The stretchable electrical conductor of claim 6 further comprising openings formed in said substrate, wherein said contact of said device and said contact of another device access said stretchable electrical conductor through said openings.

16. The stretchable electrical conductor of claim 6 further comprising a plurality of layers of said conductive material formed on or embedded between a plurality of layers of said stretchable substrate.

17. The stretchable electrical conductor of claim 16 wherein each layer of said stretchable substrate is pre-stretched to a predetermined pre-stretched percentage before said conductive material is formed on said substrate.

18. The stretchable electrical conductor of claim 6 wherein said predetermined percentage is in the range of about 5% to about 100%.

19. A stretchable electrical conductor for electronically and mechanically connecting electronic components of devices comprising:
   a stretchable substrate, said substrate is an elastomeric material said substrate can be stretched reversibly; and
   a plurality of layers of said conductive material formed on or embedded between a plurality of layers on said substrate, said conductive material comprises a conductive metallic film or conductive metallic stripe, said conductive metallic film or said conductive metallic strip expanding in any direction, stripe is formed on the elastomeric substrate with its longitudinal axis aligned with the longitudinal axis of the substrate, or with its longitudinal axis aligned with the lateral axis of the substrate, or with its longitudinal axis at an arbitrary angle to the longitudinal axis of the substrate, said conductive metallic film or said conductive metallic stripe is embedded in the elastomeric substrate and oriented with its longitudinal axis aligned with the longitudinal axis of the substrate, or with its longitudinal axis aligned with the lateral axis of the substrate, or with its longitudinal axis at an arbitrary angle to the longitudinal axis of the substrate, or with its longitudinal axis aligned with the transversal axis of the substrate said conductive metallic film or said conductive metallic stripe expanding along the longitudinal axis of the substrate, or along the lateral axis of the substrate and/or in any direction at an arbitrary angle to the longitudinal axis of the substrate and/or lateral axis of the substrate, or along the transversal axis of the substrate,
   said conductive metallic film or said conductive metallic stripe providing stretchability simultaneously in any direction in the longitudinal/lateral plane of the substrate, or in any direction in the longitudinal/transversal plane of the substrate, or any direction in the lateral/transversal plane of the substrate or said conductive metallic film or said conductive metallic stripe providing stretchability simultaneously in any directions of the longitudinal/lateral/transversal axis system
   wherein said conductive material extends between two of said devices for electronically coupling a contact of one device to a contact of another device and said stretchable electrical conductor is capable of being stretched up to a predetermined percentage and retain electrical conductivity wherein during forming each layer of said conductive material on each layer of said substrate, a wavy or buckled profile is formed in said stretchable electrical conductor and said substrate can be stetched substantially flat.

\* \* \* \* \*

UNITED STATES PATENT AND TRADEMARK OFFICE
CERTIFICATE OF CORRECTION

| | | |
|---|---|---|
| PATENT NO. | : 7,491,892 B2 | Page 1 of 1 |
| APPLICATION NO. | : 10/402087 | |
| DATED | : February 17, 2009 | |
| INVENTOR(S) | : Wagner et al. | |

It is certified that error appears in the above-identified patent and that said Letters Patent is hereby corrected as shown below:

At Col. 1, line 3, please insert the following Statement after the Title:

--Statement of Government Funded Research
This invention was made with government support under IIS-0080693 awarded by the National Science Foundation. The government has certain rights in the invention.--

Signed and Sealed this

Twenty-first Day of April, 2009

JOHN DOLL
*Acting Director of the United States Patent and Trademark Office*